US009871497B2

(12) United States Patent
Asada et al.

(10) Patent No.: US 9,871,497 B2
(45) Date of Patent: Jan. 16, 2018

(54) PROCESSING AUDIO SIGNAL TO PRODUCE ENHANCED AUDIO SIGNAL

(71) Applicant: SONY CORPORATION, Tokyo (JP)

(72) Inventors: Kohei Asada, Kanagawa (JP); Shinpei Tsuchiya, Kanagawa (JP); Kazunobu Ookuri, Kanagawa (JP); Yushi Yamabe, Tokyo (JP)

(73) Assignee: SONY CORPORATION, Tokyo (JP)

( * ) Notice: Subject to any disclaimer, the term of this patent is extended or adjusted under 35 U.S.C. 154(b) by 125 days.

(21) Appl. No.: 14/609,822

(22) Filed: Jan. 30, 2015

(65) Prior Publication Data

US 2015/0229286 A1 Aug. 13, 2015

(30) Foreign Application Priority Data

Feb. 10, 2014 (JP) ................................ 2014-023039

(51) Int. Cl.
*H03G 9/02* (2006.01)
*H03G 9/00* (2006.01)

(52) U.S. Cl.
CPC ............. *H03G 9/025* (2013.01); *H03G 9/005* (2013.01)

(58) Field of Classification Search
CPC ......... H03G 9/025; H03G 9/005; H03M 1/00; H03M 1/06; H03M 1/0854
USPC .......... 381/98, 71.14, 94.2, 94.3, 58, 59, 55, 381/101, 106, 107
See application file for complete search history.

(56) References Cited

U.S. PATENT DOCUMENTS 3,678,416 A * 7/1972 Burwen .................. G11B 5/00 327/553
5,873,065 A * 2/1999 Akagiri ........... G11B 20/00007 381/2
8,295,499 B2 * 10/2012 Shirakawa ........... G10L 19/025 381/106
2005/0117656 A1 * 6/2005 Gigi .................... G10L 21/0208 375/245
2009/0238379 A1 * 9/2009 Feng .................. H03M 7/3006 381/94.5

FOREIGN PATENT DOCUMENTS

JP 2008-543194 A 11/2008

* cited by examiner

*Primary Examiner* — Xu Mei
*Assistant Examiner* — Jason R Kurr
(74) *Attorney, Agent, or Firm* — Chip Law Group

(57) ABSTRACT

A signal processing apparatus includes a transform unit configured to orthogonally transform an audio signal; an analysis unit configured to analyze the audio signal orthogonally transformed by the transform unit and estimate a very high frequency stationary signal component; and a signal processing unit configured to perform signal processing to reduce the very high frequency stationary signal component estimated by the analysis of the analysis unit with respect to the audio signal.

19 Claims, 19 Drawing Sheets

Determine fc and the like by control parameter reflecting analysis result

A

Determine inclination (dB/oct) and the like by control parameter reflecting analysis result

B

Determine gain of TSF and the like by control parameter reflecting analysis result

C

| Volume 0 | paramA0, paramB0, …… |
| --- | --- |
| Volume 1 | paramA1, paramB1, …… |
| Volume 2 | paramA2, paramB2, …… |
| …… | …… |
| Volume 28 | paramA28, paramB28, …… |
| Volume 29 | paramA29, paramB29, …… |
| Volume 30 | paramA30, paramB30, …… |

FIG.17

PROCESSING AUDIO SIGNAL TO PRODUCE ENHANCED AUDIO SIGNAL

CROSS REFERENCE TO RELATED APPLICATIONS

This application claims the benefit of priority under 35 U.S.C. §119 from Japanese Priority Patent Application JP 2014-023039 filed Feb. 10, 2014, the entire contents of each which is incorporated herein by reference.

BACKGROUND

The present disclosure relates to a signal processing apparatus and a signal processing method, and more particularly to a signal processing apparatus and a signal processing method that can reproduce audio data including a very high frequency more securely while suppressing reduction in audio quality.

In recent years, there has been a wide use of audio data including a very high frequency signal component which is a higher-frequency band (for example, 20 kHz or more) than a frequency band commonly called an audible band (so-called data of high-resolution) (hereinafter referred to as high-resolution data).

This very high frequency may include a large amount of noise components formed of, for example, a noise shaper. It is difficult for a user to hear such very high frequency noise, so that the user is likely to perform volume adjustment based on reproduction volume of the audible band. Accordingly, the reproduction volume of the very high frequency noise is excessively increased, which overloads a reproduction device such as an amplifier and a speaker and can lead to breakdowns and the like.

Then, it is conceivable to suppress signal amplification (gain) at the time of reproduction to perform reproduction more safely. For example, there has been proposed a method of determining whether an input signal is noise or audio data with use of an autocorrelation and decreasing a gain when it is determined as the noise (for example, see Japanese Patent Application Laid-open No. 2008-543194).

SUMMARY

However, when determining the input signal including the audio data and the noise as the noise, the method described in Japanese Patent Application Laid-open No. 2008-543194 also decreases the gain of the audio data, which may reduce audio quality at the time of reproduction. Moreover, the gain of all bands is decreased, which may reduce audio quality at the time of reproduction.

The present technology has been made in view of the above circumstance, and it is desirable to provide a signal processing apparatus and a signal processing method that can reproduce audio data including a very high frequency more securely while suppressing reduction in audio quality.

According to an embodiment of the present technology, there is provided an signal processing apparatus including a transform unit configured to orthogonally transform an audio signal; an analysis unit configured to analyze the audio signal orthogonally transformed by the transform unit and estimate a very high frequency stationary signal component; and a signal processing unit configured to perform signal processing to reduce the very high frequency stationary signal component estimated by the analysis of the analysis unit with respect to the audio signal.

The very high frequency is higher-frequency than an audible band.

The stationary signal component is a component which increases a level toward the high frequency.

The stationary signal component is a component without including a harmonic component of a signal component of an audible band.

The signal processing unit can reduce the very high frequency stationary signal component by a spectral subtraction.

The signal processing unit can reduce the very high frequency stationary signal component by a Wiener filter. The transform unit can perform a fast Fourier transform on the audio signal.

The signal processing apparatus can further include a band division unit configured to band-divide the audio signal into the very high frequency signal component and a signal component other than the very high frequency; and a synthesis unit configured to synthesize the audio signal whose very high frequency stationary signal component is reduced by the signal processing unit and a signal component other than the very high frequency of the audio signal obtained by the band division unit band-dividing the audio signal, in which the transform unit orthogonally transforms the very high frequency signal component of the audio signal obtained by the band division unit band-dividing the audio signal, the analysis unit analyzes the very high frequency signal component of the audio signal orthogonally transformed by the transform unit and estimates the very high frequency stationary signal component, the signal processing unit performs signal processing to reduce the very high frequency stationary signal component estimated by the analysis of the analysis unit with respect to the very high frequency signal component of the audio signal obtained by the band division unit band-dividing the audio signal, and the synthesis unit synthesizes the very high frequency signal component of the audio signal whose very high frequency stationary signal component is reduced by the signal processing unit and the signal component other than the very high frequency of the audio signal obtained by the band division unit band-dividing the audio signal.

The band division unit can include a high-pass filter configured to extract the very high frequency signal component from the audio signal and a low-pass filter configured to extract the signal component other than the very high frequency from the audio signal.

The signal processing apparatus can further include a high-pass filter configured to remove the signal component other than the very high frequency from the audio signal whose very high frequency stationary signal component is reduced by the signal processing unit, in which the synthesis unit synthesizes the audio signal whose signal component other than the very high frequency is removed by the high-pass filter and the signal component other than the very high frequency of the audio signal obtained by the band division unit band-dividing the audio signal.

The signal processing unit can reduce the very high frequency stationary signal component in accordance with an amplification amount of the audio signal.

The signal processing unit can reduce the very high frequency stationary signal component by a low-pass filter having a cut-off frequency in accordance with the amplification amount of the audio signal.

The signal processing unit can reduce the very high frequency stationary signal component by a low-pass filter having a frequency characteristic of an inclination in accordance with the amplification amount of the audio signal in a band equal to or higher than a cut-off frequency.

The signal processing unit can reduce the very high frequency stationary signal component by a treble shelving filter (TSF) having a gain in accordance with the amplification amount of the audio signal.

The signal processing unit can reduce the very high frequency stationary signal component by a limiter having a threshold in accordance with the amplification amount of the audio signal with respect to the very high frequency.

The analysis unit can analyze partial data of the audio signal, which corresponds to a predetermined partial time of a reproduction time of the audio signal, and estimate the very high frequency stationary signal component.

The analysis unit can analyze partial data of the audio signal, which corresponds to an initial partial time of the reproduction time of the audio signal, and estimate the very high frequency stationary signal component.

The analysis unit can analyze partial data of the audio signal, which corresponds to an intermediate partial time of the reproduction time of the audio signal, and estimate the very high frequency stationary signal component, and the signal processing unit can update the stationary signal component to be reduced in accordance with a latest analysis result of the analysis unit only when necessary.

The signal processing apparatus can further include an encoder configured to encode the audio signal whose very high frequency stationary signal component is reduced by the signal processing unit.

A signal processing method according to an embodiment of the present technology is a signal processing method including orthogonally transforming an audio signal; analyzing the orthogonally transformed audio signal and estimating a very high frequency stationary signal component; and performing signal processing to reduce the estimated very high frequency stationary signal component with respect to the audio signal.

According to an embodiment of the present technology, an audio signal is orthogonally transformed; the orthogonally transformed audio signal is analyzed and a very high frequency stationary signal component is estimated; and signal processing to reduce the estimated very high frequency stationary signal component is performed with respect to the audio signal.

According to an embodiment of the present disclosure, signal processing can be performed. In particular, it is possible to reproduce audio data including a very high frequency more securely while suppressing reduction in audio quality.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 17 is a diagram showing an example of a volume control database;

DETAILED DESCRIPTION OF EMBODIMENTS

Embodiments for carrying out the present disclosure (hereinafter referred to as embodiments) will be described below. The description will be given in the following order:

1. First embodiment (reproduction apparatus)
2. Second embodiment (reproduction apparatus)
3. Third embodiment (transmitter)
4. Fourth embodiment (reproduction apparatus)
5. Fifth embodiment (computer)

1. First Embodiment

<Reproduction of High-Resolution Data>

In recent years, there has been a wide use of audio data including a very high frequency signal component which is a higher-frequency band (for example, 20 kHz or more) than a frequency band commonly called an audible band (so-called data of high-resolution) (hereinafter referred to as high-resolution data).

For example, the user has more opportunities to enjoy music reproduction having higher quality by downloading and purchasing music data as high-resolution data whose sampling frequency and the number of quantization bits are larger than a format of an audio compact disc (CD) of the related art and using a dedicated apparatus such as a personal computer (PC) and a universal serial bus—digital analog converter (USB-DAC) as a result of the expansion of communication environment such as the Internet.

The very high frequency included in this high-resolution data has, for example, noise originated from an analog digital converter (ADC) of a recording apparatus at the time of recording a sound source, in addition to sound such as the original music piece. In particular, when so-called 1bitADC ($\Delta\Sigma$ type) is used, it is necessary to transfer a noise component of an audible band to a very high frequency by a noise shaper and improve an SN ratio of the audible band. Accordingly, the high-resolution data generated by this method may include a large amount of noise components formed of the noise shaper in the very high frequency.

Figure 1:
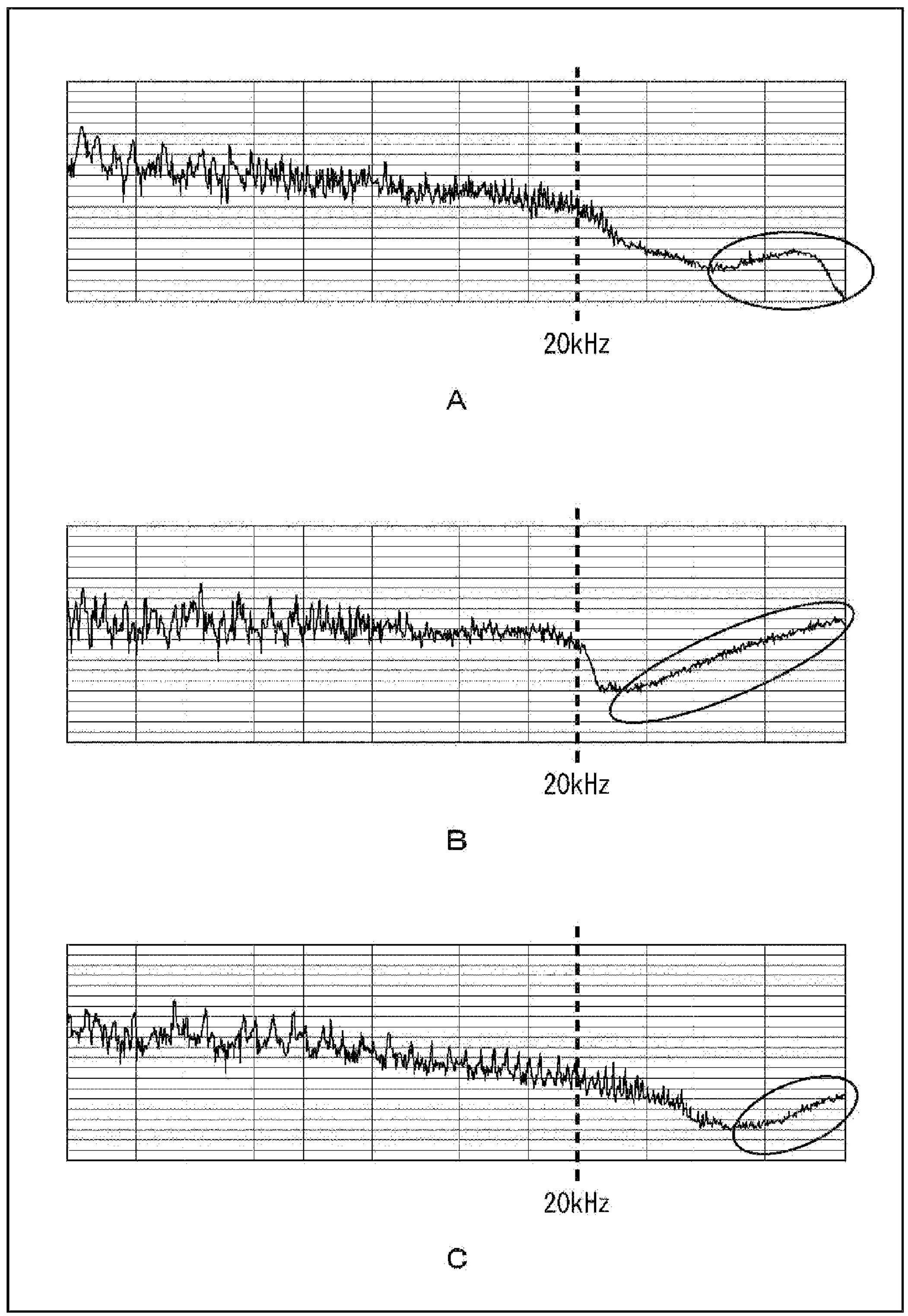
FIG. 1 is a diagram describing an example of a signal waveform.

FIG. 1 shows an example of a frequency analysis result of the high-resolution data (Fs192 kHz). A to C of FIG. 1 show analysis results of audio data different from each other. Each data includes stationary noise which little changes with time in the very high frequency equal to or higher than 20 kHz (portions enclosed by the ellipses). Other portions (particularly, audible band equal to or lower than 20 kHz) are mainly constituted of the original sound signal, and its spectrum momentarily changes.

1bitADC is used for these high-resolution data at the time of recording, and the above described stationary noise (portions enclosed by the ellipses) is manly formed of the noise shaper mounted on the 1bitADC. Therefore, an amount of the noise and an inclination of a frequency characteristic depend on the ADC.

As shown in A to C of FIG. 1, this noise increases as a frequency increases, which becomes obviously unnatural with respect to a case where a noise component in the real physical world decreases together with the frequency. Moreover, this noise may obscure a harmonic with respect to music and instrument signals in an actual audible band.

That is, in the very high frequency of the high-resolution data, unnecessary stationary noise by the noise shaper and the like as well as sound equal to or higher than the audible band from a desired sound source may be mixed.

The problem with this very high frequency noise is that it is difficult for the user to hear the noise at the time of reproduction. Accordingly, the user is likely to perform volume adjustment (gain adjustment) based on reproduction volume of the audible band without worrying about the reproduction volume of this noise. Accordingly, the reproduction volume of the very high frequency noise is excessively increased, which overloads a reproduction device such as an amplifier and a speaker and can lead to breakdowns and the like.

In particular, in the case of an example shown in B of FIG. 1, a signal level of the very high frequency noise is larger than a signal level of the audible band. Therefore, when the volume adjustment (gain adjustment) is performed in accordance with the signal level of the audible band, volume of the very high frequency noise is further increased, which can overloads a reproducing apparatus.

Then, it is conceivable to suppress signal amplification (gain) at the time of reproduction to perform reproduction more safely. However, for example, simply cutting or suppressing the very high frequency loses its original meaning with respect to reproduction of a high-resolution content.

Moreover, for example, Japanese Patent Application Laid-open No. 2008-543194 describes a method of determining whether an input signal is noise or audio data with use of an autocorrelation and decreasing a gain when it is determined as the noise.

However, when determining the input signal including the audio data and the noise as the noise, the method described in Japanese Patent Application Laid-open No. 2008-543194 also decreases the gain of the audio data, which may reduce audio quality at the time of reproduction. Moreover, the gain of all bands is decreased, which may reduce audio quality at the time of reproduction.

<Estimation and Reduction of Very High Frequency Stationary Signal Component>

Then, to allow for reproducing the audio data including the very high frequency more securely while suppressing reduction in audio quality, it is configured to analyze the orthogonally transformed audio signal, estimate a very high frequency stationary signal component, and perform signal processing to reduce the estimated very high frequency stationary signal component with respect to the audio signal.

<Reproduction Apparatus>

Figure 2:
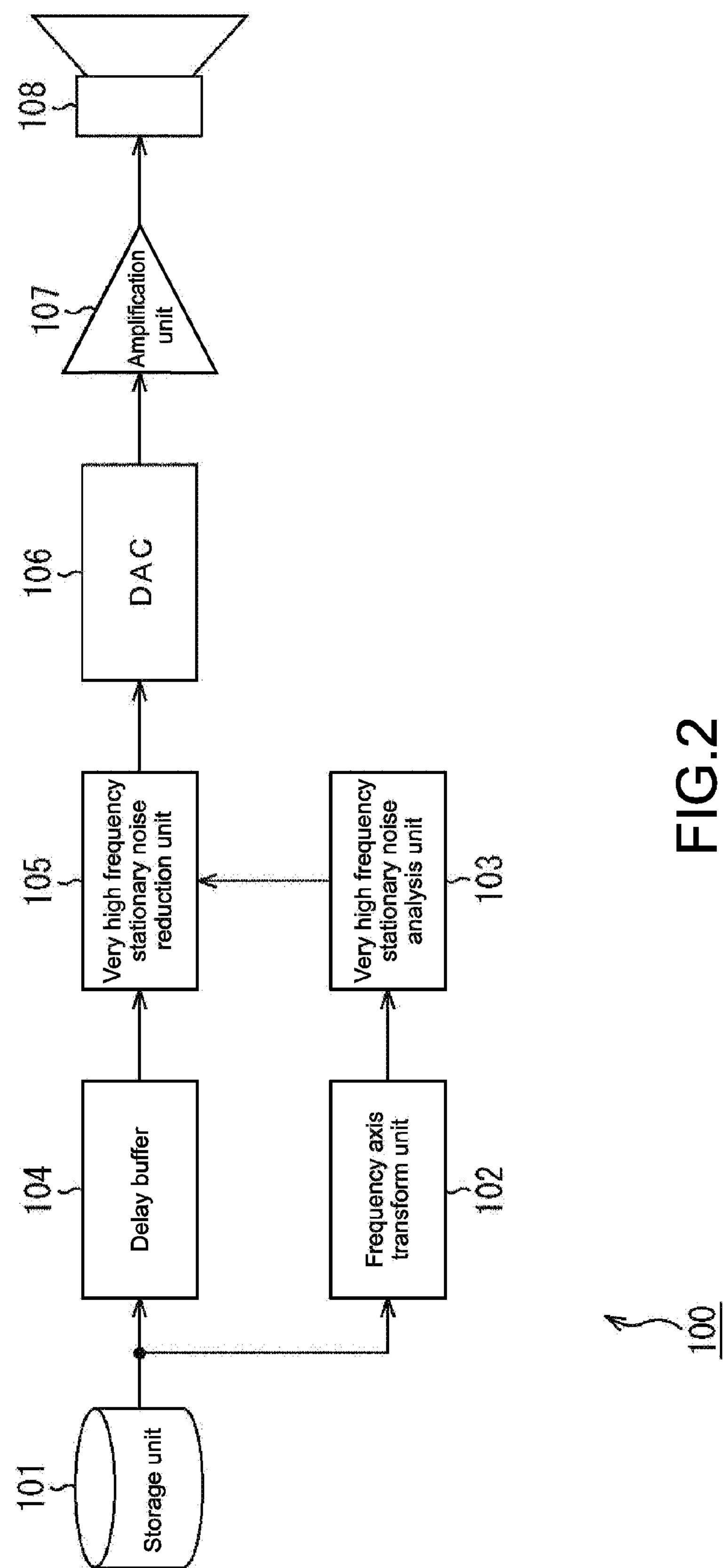
FIG. 2 is a block diagram showing a main configuration example of a reproduction apparatus.

FIG. 2 is a block diagram showing a main configuration example of a reproduction apparatus according to an embodiment of a signal processing apparatus to which the present technology is applied. A reproduction apparatus 100 shown in FIG. 2 is an apparatus which reproduces and outputs the high-resolution data (audio data).

As shown in FIG. 2, the reproduction apparatus 100 includes a storage unit 101, a frequency axis transform unit 102, a very high frequency stationary noise analysis unit 103, a delay buffer 104, a very high frequency stationary noise reduction unit 105, a DAC 106, an amplification unit 107, and a speaker 108.

The storage unit 101 has an arbitrary recording medium such as a hard disk, a flash memory or an optical disk and stores high-resolution data of digital data (hereinafter also referred to as digital high-resolution data). The digital high-resolution data to be reproduced is read from the storage unit 101 and is supplied to the frequency axis transform unit 102 and the delay buffer 104.

The frequency axis transform unit 102, constituted of, for example, a central processing unit (CPU), a read only memory (ROM), a random access memory (RAM), and the like, performs a Fourier transform (for example, fast Fourier transform (FFT)) on the digital high-resolution data to be supplied, and generates a frequency spectrum. The frequency axis transform unit 102 supplies the frequency spectrum to the very high frequency stationary noise analysis unit 103. Although the CPU is described in this embodiment, calculation itself may be made by a micro processing unit (MPU) and a digital signal processor (DSP).

The very high frequency stationary noise analysis unit 103, constituted of, for example, the CPU, the ROM, the RAM and the like, analyzes the frequency spectrum and estimates very high frequency stationary noise. The very high frequency stationary noise analysis unit 103 supplies the analysis result to the very high frequency stationary noise reduction unit 105.

To complete the above described analysis before signal processing, the delay buffer 104 temporarily retains the supplied digital high-resolution data and delays a reproduction timing. After retaining the digital high-resolution data for a predetermined time, the delay buffer 104 supplies the data to the very high frequency stationary noise reduction unit 105.

The very high frequency stationary noise reduction unit 105, constituted of, for example, the CPU, the ROM, the RAM and the like, performs signal processing for reducing the very high frequency stationary noise included in the digital high-resolution data with respect to the digital high-resolution data supplied from the delay buffer 104 in accordance with the analysis result supplied from the very high frequency stationary noise analysis unit 103.

For example, the very high frequency stationary noise reduction unit 105 uses a spectral subtraction based technique and a Wiener filter to reduce the very high frequency stationary noise. The spectral subtraction is a technique for removing, from a sound signal, the noise estimated with use of the stationary noise. In the case of using this spectral subtraction, the very high frequency stationary noise reduction unit 105 expands the digital high-resolution data on a frequency axis by the FFT and the like and performs subtraction processing on a noise characteristic distribution referenced on the frequency axis. Subsequently, the very high frequency stationary noise reduction unit 105 returns the data to a time axis by an inverse Fourier transform (for example, Inverse Fast Fourier Transform (IFFT)) and the like. That is, at an initial time point where a music signal is processed, it is necessary to determine the "noise characteristic" to be referenced (subtracted). Consequently, the delay buffer 104 is provided before the very high frequency stationary noise reduction unit 105 so that very high frequency stationary noise analysis unit 103 can prefetch the digital high-resolution data to some extent with respect to the very high frequency stationary noise reduction unit 105.

The very high frequency stationary noise reduction unit 105 supplies, to the DAC 106, the digital high-resolution data subjected to the signal processing.

The DAC 106 performs D/A conversion on the digital high-resolution data to be supplied and supplied the data to the amplification unit 107 as a sound signal of an analog signal (hereinafter also referred to as audio signal). The amplification unit 107 amplifies an audio signal to be supplied and supplies it to the speaker 108. The speaker 108 converts the audio signal to be supplied into a physical vibration and outputs it as sound such as voice and music.

<Flow of Reproduction Processing>

Processing executed by the reproduction apparatus 100 configured as described above will be described. First, referring to a flowchart in FIG. 3, an example of a flow of reproduction processing executed by the reproduction apparatus 100 will be described.

Upon start of the reproduction processing, the frequency axis transform unit 102 and the very high frequency stationary noise analysis unit 103 analyze very high frequency stationary noise included in the digital high-resolution data to be reproduced, in step S101.

In step S102, the delay buffer 104 reads the digital high-resolution data to be reproduced from the storage unit 101. The delay buffer 104 temporarily retains the read digital high-resolution data and delays the data until the processing is completed in step S101.

After the processing is completed in step S101, in step S103, the very high frequency stationary noise reduction unit 105 reduces the very high frequency stationary noise included in the digital high-resolution data by the signal processing of, for example, the spectral subtraction based on the analysis result in step S101.

In step S104, the DAC 106 performs D/A conversion on the digital high-resolution data whose very high frequency stationary noise is reduced in step S103 and generates an analog audio signal.

In step S105, the amplification unit 107 amplifies the audio signal by a predetermined gain.

In step S106, the speaker 108 outputs the audio signal as sound. Upon completion of the processing of step S106, the reproduction processing is completed.

<Flow of Analysis Processing>

Next, referring to a flowchart in FIG. 4, an example of a flow of analysis processing executed in step S101 of FIG. 3 will be described. Description will be made with reference to FIG. 5, as appropriate.

Upon start of the analysis processing, the frequency axis transform unit 102 reads the digital high-resolution data to be reproduced from the storage unit 101 in step S111. In step S112, the frequency axis transform unit 102 performs a Fourier transform on the read digital high-resolution data.

In step S113, the very high frequency stationary noise analysis unit 103 performs smoothing on the frequency axis.

In step S114, the very high frequency stationary noise analysis unit 103 uses a very high frequency component of frequency axis data (frequency spectrum) at a plurality of times obtained as described above to estimate the very high frequency stationary noise.

Figure 5:
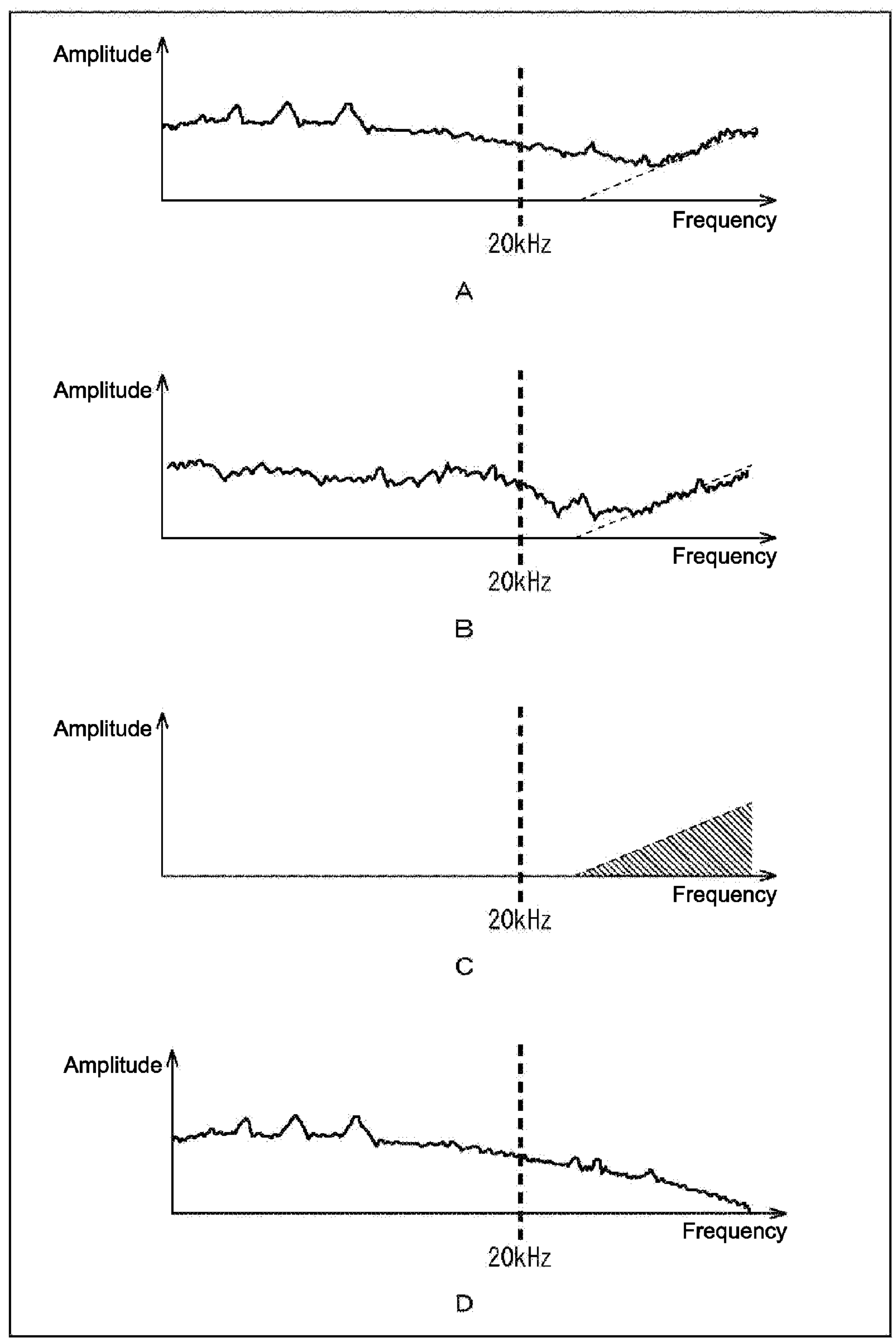
FIG. 5 is a diagram describing an example of a state of signal processing.

For example, between frequency spectra at the plurality of times as shown in A and B of FIG. 5, each frequency spectrum is averaged and a very high frequency stationary component as shown in C of FIG. 5 (shaded portion in C of FIG. 5) is estimated as noise.

Figure 3:
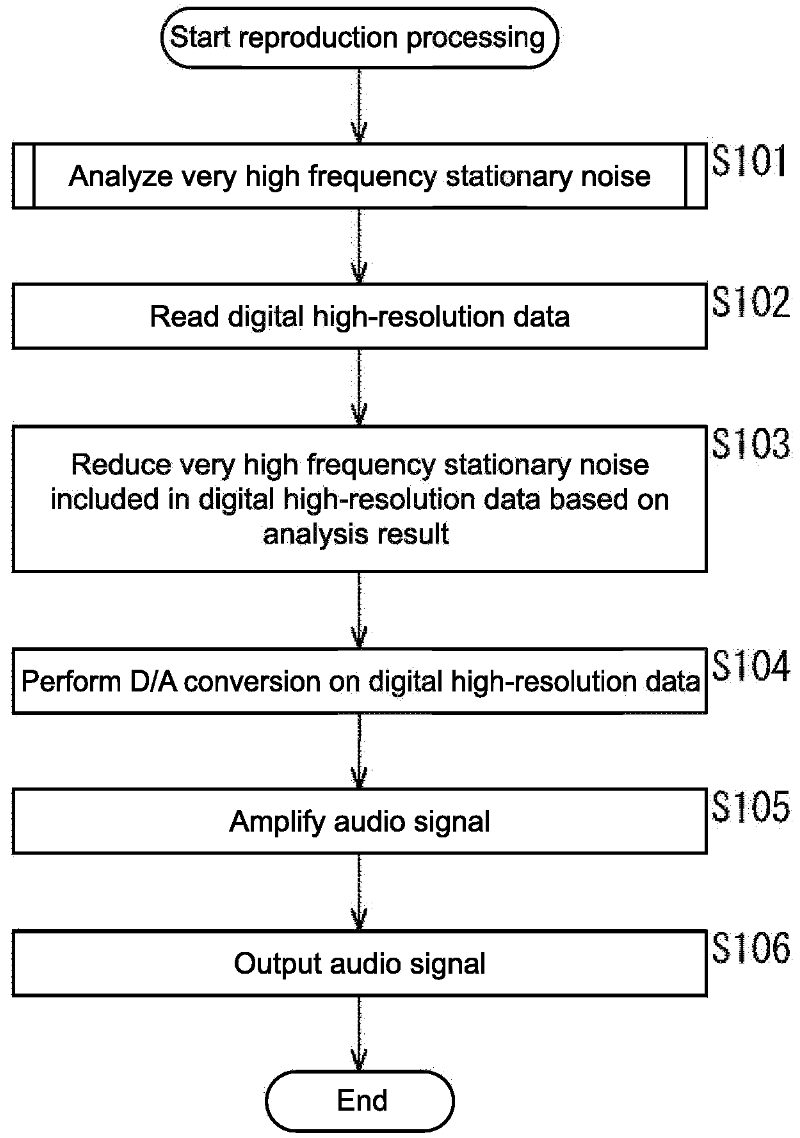
FIG. 3 is a flowchart describing an example of a flow of reproduction processing.
Figure 4:
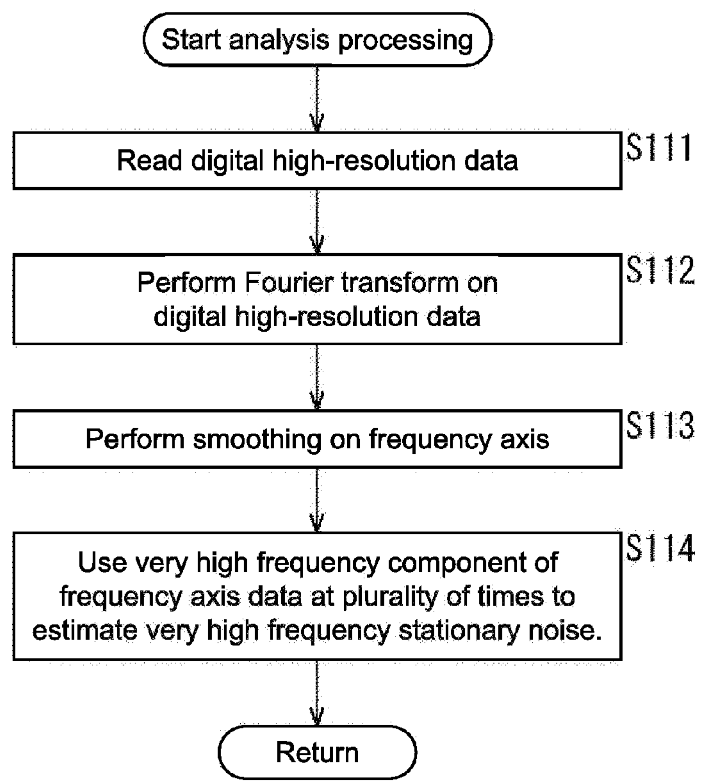
FIG. 4 is a flowchart describing an example of a flow of analysis processing.

Upon completion of the processing of step S114, the analysis processing is completed and the processing returns to FIG. 3.

The very high frequency stationary noise reduction unit 105 uses this analysis result to perform signal processing on the high-resolution data to be reproduced, thereby reducing the stationary noise included in the digital high-resolution data as shown in D of FIG. 5.

Therefore, the reproduction apparatus 100 can amplify and output the audio signal whose very high frequency stationary noise is reduced, so that an excessive load applied to a speaker and an amplifier due to an excessive sound pressure of the very high frequency noise can be suppressed. That is, the reproduction apparatus 100 can reproduce the audio data including the very high frequency more securely. Also in the very high frequency, an originally existed energy component is left and originally unnecessary noise is estimated and reduced, so that the reproduction apparatus 100 can reproduce the audio data while suppressing reduction in audio quality.

That is, the signal processing apparatus to which the present technology is applied includes the transform unit configured to orthogonally transform an audio signal as in the frequency axis transform unit 102 described above, the analysis unit configured to analyze the audio signal orthogonally transformed by the transform unit and estimate a very high frequency stationary signal component as in the very high frequency stationary noise analysis unit 103 described above, and a signal processing unit configured to perform signal processing to reduce the very high frequency stationary signal component estimated by the analysis of the analysis unit with respect to the audio signal as in the very high frequency stationary noise reduction unit 105 described above, so that it is possible to reproduce the audio data including the very high frequency more securely while suppressing reduction in audio quality similar to the reproduction apparatus 100.

Moreover, a signal processing method to which the present technology is applied includes orthogonally transforming an audio signal as in the frequency axis transform unit 102 described above, analyzing the orthogonally transformed audio signal and estimating a very high frequency stationary signal component as in the very high frequency stationary noise analysis unit 103 described above, and performing signal processing to reduce the very high frequency stationary signal component estimated with respect to the audio signal as in the very high frequency stationary noise reduction unit 105 described above, so that it is possible to reproduce the audio data including the very high frequency more securely while suppressing reduction in audio quality similar to the reproduction apparatus 100.

It should be noted that this very high frequency may be higher-frequency than an audible band as described above, for example. Moreover, the stationary signal component may be a component which increases a level toward the high frequency, for example. Further, as described above, the signal processing unit may reduce the very high frequency stationary noise component by the spectral subtraction or may reduce the very high frequency stationary signal component by a Wiener filter. Moreover, as described above, the transform unit may perform the fast Fourier transform on the audio signal.

<Flow of Analysis Processing>

Moreover, the stationary signal component may be a component without including a harmonic component of a signal component of an audible band. That is, the harmonic component of the signal component of the audible band may be removed from the noise to be reduced.

Figure 6:
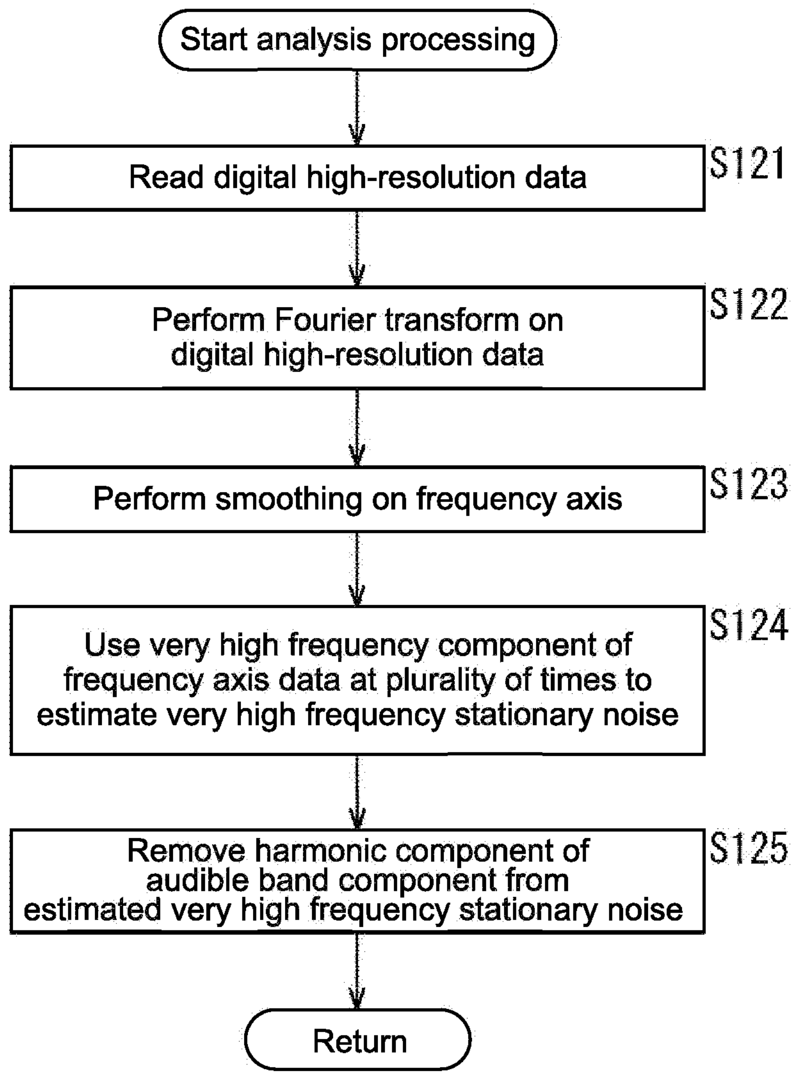
FIG. 6 is a flowchart describing an example of a flow of the analysis processing.

Referring to a flowchart in FIG. 6, an example of a flow of analysis processing in that case will be described. As shown in the flowchart in FIG. 6, in this case as well, each processing of step S121 to step S124 is executed similar to each processing of step S111 to step S114 in the case of FIG. 4. That is, as with the case of FIG. 4, the very high frequency stationary noise is estimated.

Upon estimation of the very high frequency stationary noise, in step S125, the very high frequency stationary noise analysis unit 103 removes the harmonic component of the signal component of the audible band from the very high frequency stationary noise estimated in step S124.

The very high frequency stationary noise analysis unit 103 supplies the very high frequency stationary noise whose harmonic component of the signal component of the audible band is removed to the very high frequency stationary noise reduction unit 105 as an analysis result.

Upon completion of the processing of step S124, the analysis processing is completed and the processing returns to FIG. 3.

The very high frequency stationary noise reduction unit 105 uses the foregoing analysis result to perform signal processing, thereby enabling reduction in the very high frequency stationary noise without including the harmonic component of the signal component of the audible band. This allows the reproduction apparatus 100 (signal processing apparatus to which the present technology is applied) to further suppress reduction in the audio quality in reproduction of the high-resolution data.

<Analysis Timing>

It should be noted that analysis of the foregoing very high frequency stationary noise (estimation of the very high frequency stationary noise) may be performed at any timing as long as the analysis is performed prior to a timing of reproduction and output of the digital high-resolution data. For example, the analysis may be executed at a predetermined timing or may be executed when instruction is received from outside, a predetermined parameter is changed, and a predetermined event occurs.

Moreover, since it is sufficient to estimate the stationary noise, not all the high-resolution data need be used for the analysis. The analysis may be performed by using only a part of the high-resolution data (partial data corresponding to a predetermined part of a reproduction time (for example, partial data corresponding to a predetermined time from an initial point or intermediate point)).

Figure 7:
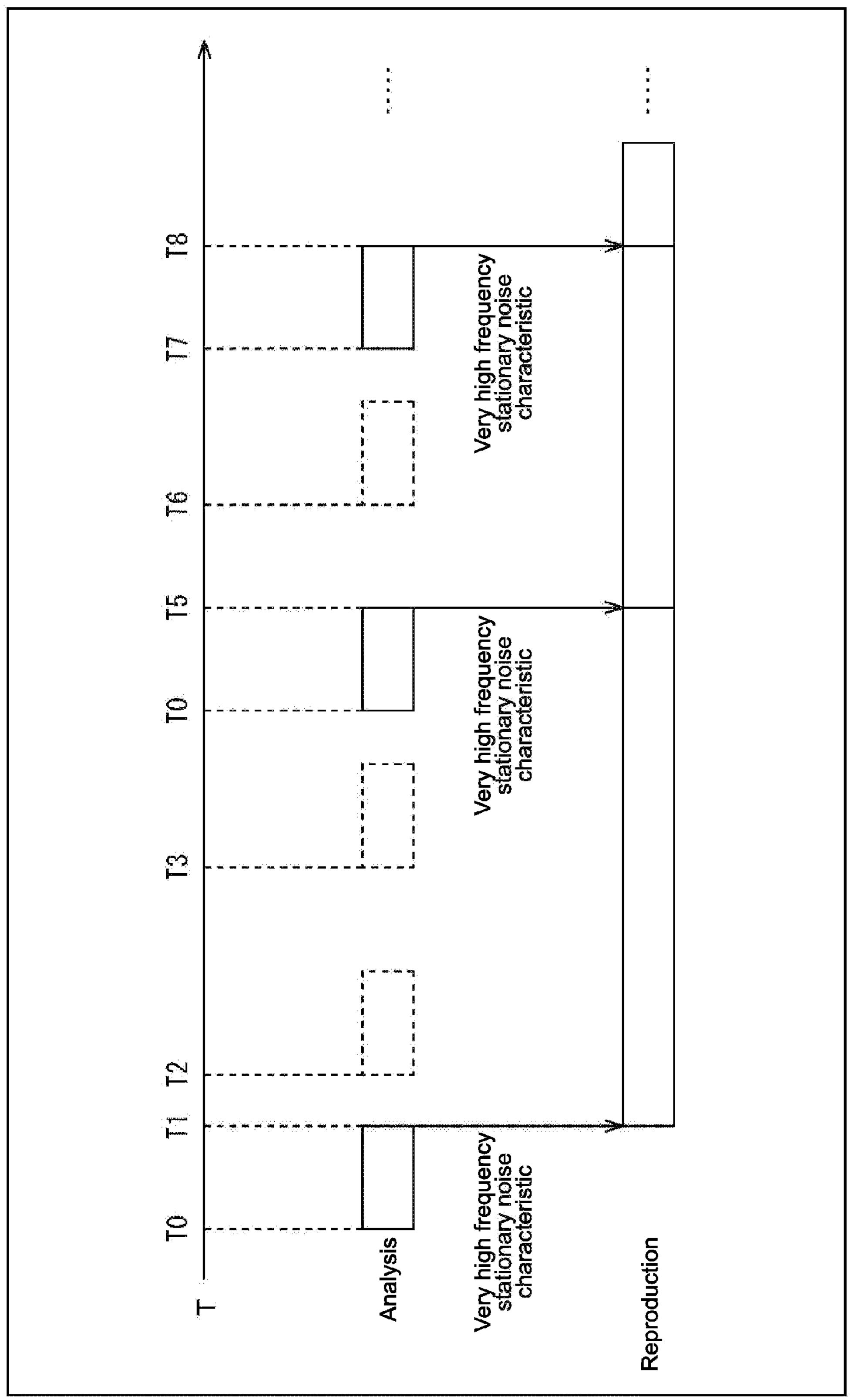
FIG. 7 is a diagram describing an example of a timing of executing processing.

For example, as shown in FIG. 7, in a timing (time T0) prior to a timing (time T1) where reproduction of the high-resolution data (music piece) is started, a part of the high-resolution data (part corresponding to the time T0 to the time T1) is analyzed, and the analysis result (very high frequency stationary noise characteristic) may be used to perform reproduction of the high-resolution data (signal processing to reduce the noise in reproduction) from the time T1.

Moreover, for example, during the reproduction (after the time T1) of the high-resolution data (music piece), the analysis is performed regularly or irregularly (times T2, T3, T4, T6, and T7 in the case of FIG. 7) and a value of the analysis result (very high frequency stationary noise characteristic) used for the reproduction of the high-resolution data (signal processing to reduce the noise in reproduction) may be updated as appropriate (for example, if a significant change occurs in the analysis result (very high frequency stationary noise characteristic)). In the case of an example shown in FIG. 7, a significant change occurs in the analysis result performed in the time T4 and the time T7.

That is, the analysis result performed in the time T1 is used for the reproduction of the high-resolution data of the time T1 to the time T5 (signal processing to reduce the noise in reproduction). Then, since the significant change occurs in the analysis result performed in the time T4, the analysis result to be used is updated and the analysis result performed in the time T4 is used for the reproduction of the high-resolution data of the time T5 to the time T8 (signal processing to reduce the noise in reproduction). Further, since the significant change occurs in the analysis result performed in the time T7, the analysis result to be used is further updated and the analysis result performed in the time T7 is used for the reproduction of the high-resolution data after the time T8 (signal processing to reduce the noise in reproduction).

It is obvious that the analysis may be performed irrespective of the reproduction of the high-resolution data as long as the analysis is performed in a timing prior to the reproduction timing of the high-resolution data. For example, when the storage unit 101 stores the high-resolution data, the analysis may be performed. In that case, for example, the very high frequency stationary noise analysis unit 103 and the very high frequency stationary noise reduction unit 105 may retain the analysis result until the reproduction of the high-resolution data (signal processing to reduce the noise in reproduction). Moreover, a storage unit for storing the analysis result may be newly provided. It should be noted that this case eliminates the necessity to delay the reproduction timing so that the reproduction timing is matched with the analysis timing, thereby allowing for omitting the delay buffer 104.

The foregoing analysis can suppress the load of the processing and an increase in power consumption in accordance with the analysis.

2. Second Embodiment

<Band Division>

It should be noted that the above described signal processing for reducing the stationary noise may be performed on only a part of the band. For example, it may be configured such that the high-resolution data to be reproduced is band-divided into the very high frequency and a band equal to or lower than the audible band, followed by performing the above described signal processing for reducing the stationary noise on only the very high frequency.

Noise reduction processing is generally a nonlinear signal processing technique and the audio quality of the signal desired is also influenced and degraded as a degree of the noise reduction increases. In particular, unless the high-resolution data is subjected to processing with high accuracy or little processing (direct reproduction), it is difficult to eliminate influence on the audio quality. The reproduction apparatus 100 shown in FIG. 2 allows the very high frequency stationary noise reduction unit 105 to perform FFT/IFFT including all the audible bands. Accordingly, it is likely to influence the audio quality due to the way in which calculation accuracy and an FFT frame are determined (namely, this may reduce the audio quality).

Then, the band is divided as described above and the band equal to or lower than the audible band is subjected to no signal processing as much as possible, other than delay processing, so that reduction in the audio quality can be further suppressed. It should be noted that as the frequency increases, an auditory sense is generally that its energy is more important than a time and a phase property, so that it is difficult to change the very high frequency into the audio quality of levels that a human can perceive even when a phase is slightly changed by the spectral subtraction.

<Reproduction Apparatus>

Figure 8:
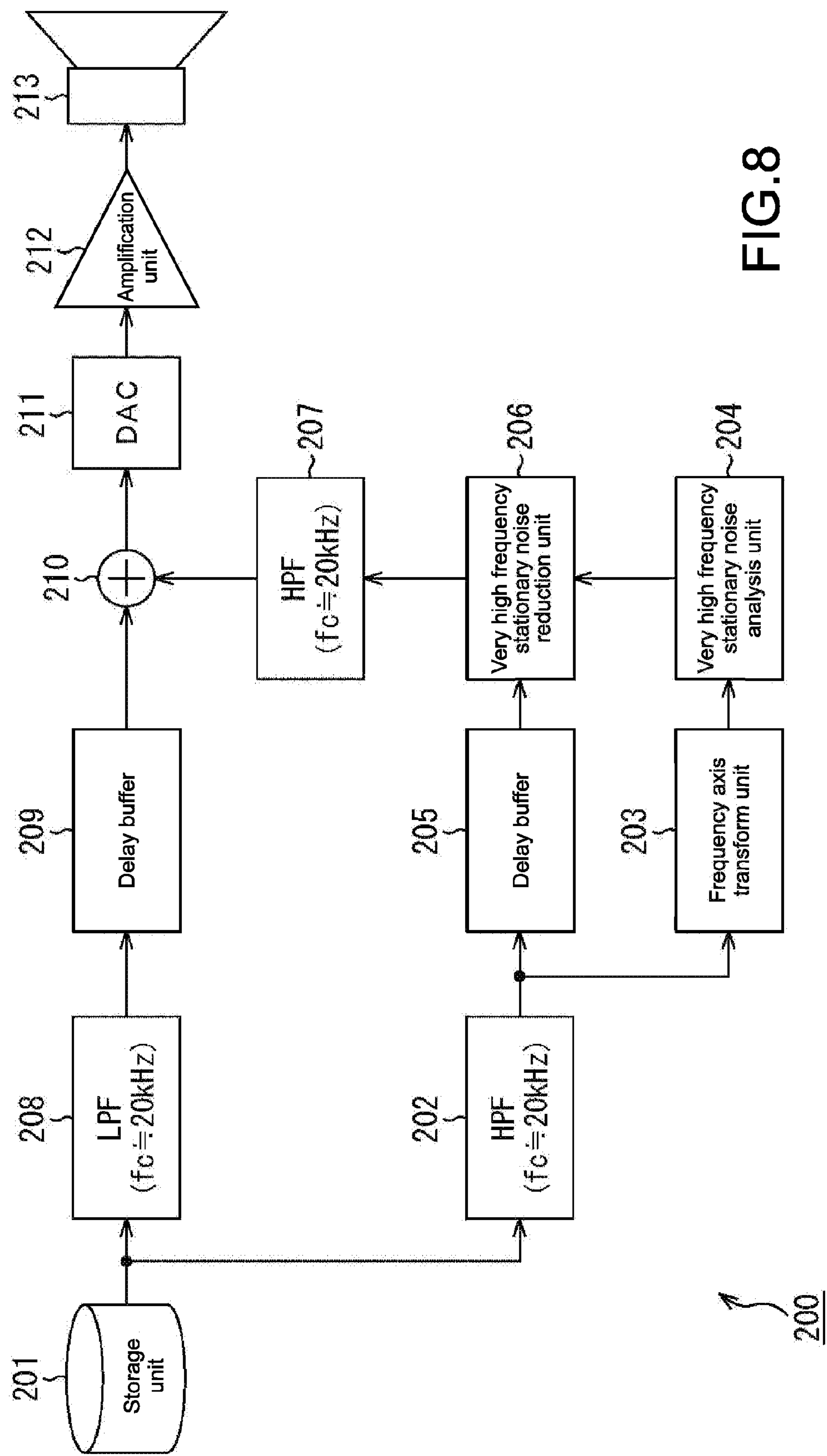
FIG. 8 is a block diagram showing another configuration example of the reproduction apparatus.

FIG. 8 is a block diagram showing a main configuration example of a reproduction apparatus in that case. A reproduction apparatus 200 shown in FIG. 8 is an apparatus that performs the signal processing to which the present technology is applied, suppresses and reproduces the very high frequency stationary noise of the digital high-resolution data similar to the reproduction apparatus 100. However, the reproduction apparatus 200 band-divides the digital high-resolution data and performs the signal processing to which the present technology is applied on only its very high frequency component.

As shown in FIG. 8, the reproduction apparatus 200 according to an embodiment of the signal processing apparatus includes a storage unit 201, a high pass filter (HPF) 202, a frequency axis transform unit 203, a very high frequency stationary noise analysis unit 204, a delay buffer 205, a very high frequency stationary noise reduction unit 206, an HPF 207, a low pass filter (LPF) 208, a delay buffer 209, a calculation unit 210, a digital analog converter (DAC) 211, an amplification unit 212, and a speaker 213.

The storage unit 201 is a storage unit similar to the storage unit 101 and stores the digital high-resolution data. The digital high-resolution data to be reproduced is read from the storage unit 201 and is supplied to the HPF 202 and the LPF 208.

The HPF 202 allows a very high frequency of the digital high-resolution data to be supplied (for example, 20 kHz or more) to pass through and blocks equal to or lower than the audible band (for example, 20 kHz or less). Namely, the HPF 202 extracts its very high frequency component from the digital high-resolution data to be supplied. The HPF 202 supplies the extracted very high frequency component to the frequency axis transform unit 203 and the delay buffer 205.

The frequency axis transform unit 203 is a processing unit similar to the frequency axis transform unit 102 and performs a Fourier transform (for example, fast Fourier transform (FFT)) on the very high frequency component of the digital high-resolution data supplied from the HPF 202 and supplies the generated frequency spectra to the very high frequency stationary noise analysis unit 204.

The very high frequency stationary noise analysis unit 204 is a processing unit similar to the very high frequency stationary noise analysis unit 103 and analyzes the frequency spectra of the very high frequency component of the digital high-resolution data and estimates the very high frequency stationary noise. That is, the very high frequency stationary noise analysis unit 204 analyzes the very high frequency component of the digital high-resolution data similar to the very high frequency stationary noise analysis unit 103. The very high frequency stationary noise analysis unit 204 supplies the analysis result to the very high frequency stationary noise reduction unit 206.

The delay buffer 205 is a processing unit similar to the delay buffer 104 and temporarily retains the supplied very high frequency component of the digital high-resolution data so that its analysis is completed first, and delays a reproduction timing. After retaining the very high frequency component of the digital high-resolution data for a predetermined time, the delay buffer 205 supplies it to the very high frequency stationary noise reduction unit 206.

The very high frequency stationary noise reduction unit 206 is a processing unit similar to the very high frequency stationary noise reduction unit 105. The very high frequency stationary noise reduction unit 206 uses a spectral subtraction based technique and a Wiener filter to perform signal processing for reducing the very high frequency stationary noise included in the digital high-resolution data with respect to the very high frequency component of the digital high-resolution data supplied from the delay buffer 205 in accordance with the analysis result supplied from the very high frequency stationary noise analysis unit 204. The very high frequency stationary noise reduction unit 206 supplies, to the HPF 207, the very high frequency component of the digital high-resolution data subjected to the signal processing.

The very high frequency component of the digital high-resolution data subjected to the signal processing may include a component equal to or lower than the audible band (for example, 20 kHz or less). To prevent such a component from influencing the component equal to or lower than the audible band of the high-resolution data to be reproduced and outputted, the HPF 207 allows the supplied very high frequency (for example, 20 kHz or more) of the very high frequency component of the digital high-resolution data subjected to the signal processing to pass through and blocks equal to or lower than the audible band (for example, 20 kHz or less). The HPF 207 supplies, to the calculation unit 210, the very high frequency component of the digital high-resolution data subjected to the signal processing obtained by reducing the component equal to or lower than the audible band.

That is, the HPF 202 to HPF 207 analyze the very high frequency stationary noise and perform signal processing to reduce the very high frequency stationary noise to which the present technology is applied with respect to only the very high frequency component of the digital high-resolution data.

The LPF 208 allows the band equal to or lower than the audible band of the digital high-resolution data to be supplied (for example, 20 kHz or less) to pass through and blocks the very high frequency (for example, 20 kHz or more). Namely, the LPF 208 extracts the component equal to or lower than the audible band from the digital high-resolution data to be supplied. The LPF 208 supplies the extracted component equal to or lower than the audible band to the delay buffer 209.

The delay buffer 209 is a processing unit similar to the delay buffer 205 and temporarily retains the supplied component equal to or lower than the audible band of the digital high-resolution data for substantially the same time as that of the delay buffer 205 and delays a reproduction timing. After retaining the component equal to or lower than the audible band of the digital high-resolution data for a predetermined time, the delay buffer 209 supplies it to the calculation unit 210.

The calculation unit 210 adds the component equal to or lower than the audible band of the digital high-resolution data supplied from the delay buffer 209 and the very high frequency component of the digital high-resolution data subjected to the signal processing obtained by reducing the component equal to or lower than the audible band supplied from the HPF 207 and supplies the addition result, namely, the digital high-resolution data subjected to the signal processing, to the DAC 211.

The DAC 211 is a processing unit similar to the DAC 106 and performs D/A conversion on the digital high-resolution data to be supplied and supplied it to the amplification unit 212 as a sound signal of an analog signal (hereinafter also referred to as audio signal). The amplification unit 212 is a processing unit similar to the amplification unit 107 and amplifies the audio signal to be supplied and supplies it to the speaker 213. The speaker 213 is a processing unit similar to the speaker 108 and converts the audio signal to be supplied into a physical vibration and outputs it as sound such as voice and music.

Thus-configured reproduction apparatus 200 can suppress influence on the component equal to or lower than the audible band of the signal processing to which the present technology is applied, so that reduction in the audio quality can be further suppressed.

Namely, the signal processing apparatus to which the present technology is applied may further include a band division unit configured to band-divide the audio signal into the very high frequency signal component and a signal component other than the very high frequency as in the HPF 202 and the LPF 208 described above, and a synthesis unit configured to synthesize the audio signal whose very high frequency stationary signal component is reduced by the signal processing unit and the signal component other than the very high frequency of the audio signal obtained by the band division unit band-dividing the audio signal as in the calculation unit 210 described above, in which the transform unit orthogonally transforms the very high frequency signal component of the audio signal obtained by the band division unit band-dividing the audio signal, the analysis unit analyzes the very high frequency signal component of the audio signal orthogonally transformed by the transform unit and estimates the very high frequency stationary signal component, the signal processing unit performs signal processing to reduce the very high frequency stationary signal component estimated by the analysis of the analysis unit with respect to the very high frequency signal component of the audio signal obtained by the band division unit band-dividing the audio signal, and the synthesis unit synthesizes the very high frequency signal component of the audio signal whose very high frequency stationary signal component is reduced by the signal processing unit and the signal component other than the very high frequency of the audio signal obtained by the band division unit band-dividing the audio signal. This can further suppress reduction in the audio quality, as with the case of the reproduction apparatus 200.

Similarly, a signal processing method to which the present technology is applied may include band-dividing the audio signal into the very high frequency signal component and a signal component other than the very high frequency as in the HPF 202 and the LPF 208 described above, orthogonally transforming the very high frequency signal component of the audio signal obtained by band-dividing the audio signal, analyzing the very high frequency signal component of the audio signal orthogonally transformed and estimating the very high frequency stationary signal component, performing signal processing to reduce the very high frequency stationary signal component estimated by the analysis with respect to the very high frequency signal component of the audio signal obtained by band-dividing the audio signal, and synthesizing the very high frequency signal component of the audio signal whose very high frequency stationary signal component is reduced and the signal component other than the very high frequency of the audio signal obtained by band-dividing the audio signal. This can further suppress reduction in the audio quality, as with the case of the reproduction apparatus 200.

<Other Configuration>

For example, the reproduction apparatus 100 may omit the storage unit 101. In that case, the high-resolution data may be inputted from outside the reproduction apparatus 100 (for example, other apparatus). Moreover, the DAC 106 to the speaker 108 may be also omitted. In that case, processing of the omitted processing units may be executed outside the reproduction apparatus 100 (for example, other apparatus) as appropriate. Moreover, in that case, a function of exchanging data with outside may be provided as appropriate.

Similarly, the reproduction apparatus 200 may also omit the storage unit 201, the HPF 202, the delay buffer 205, and the HPF 207 to the speaker 213. In that case, processing of the omitted processing units may be executed outside the reproduction apparatus 200 (for example, other apparatus) as appropriate. Moreover, in that case, a function of exchanging data with outside may be provided as appropriate.

3. Third Embodiment

<Transmitter>

For example, the high-resolution data subjected to the signal processing to which the present technology is applied as described above and obtained by reducing the very high frequency stationary noise is supplied to other apparatus, and the other apparatus may reproduce and output the data. Namely, the present technology can also be applied to a signal processing apparatus other than the reproduction apparatus.

Figure 9:
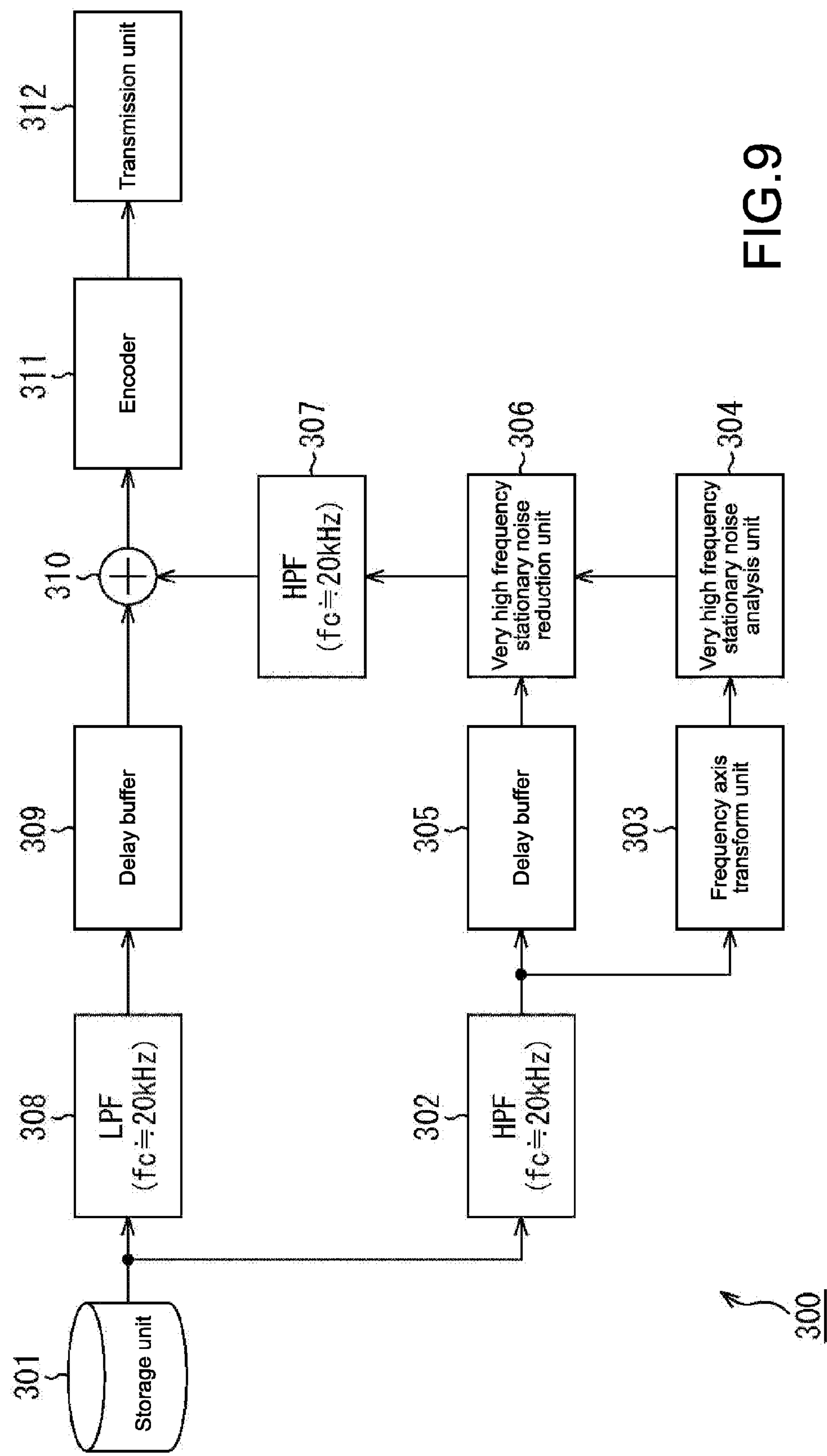
FIG. 9 is a block diagram showing a main configuration example of a transmitter.

FIG. 9 is a block diagram showing a main configuration example of a transmitter according to an embodiment of the signal processing apparatus to which the present technology is applied. A transmitter 300 shown in FIG. 9 is an apparatus which encodes the high-resolution data (audio data), transmits the data to a receiver (described later), and causes the receiver to reproduce and output the data.

As shown in FIG. 9, the transmitter 300 includes a storage unit 301, an HPF 302, a frequency axis transform unit 303, a very high frequency stationary noise analysis unit 304, a delay buffer 305, a very high frequency stationary noise reduction unit 306, an HPF 307, an LPF 308, a delay buffer 309, a calculation unit 310, an encoder 311, and a transmission unit 312.

Each processing unit from the storage unit 301 to the calculation unit 310 is a processing unit similar to each processing unit from the storage unit 201 to the calculation unit 210 of the reproduction apparatus 200 and performs similar processing. Namely, the transmitter 300 has a configuration basically similar to that of the reproduction apparatus 200 and includes the encoder 311 and the transmission unit 312, instead of the DAC 211, the amplification unit 212, and the speaker 213.

The encoder 311, constituted of, for example, the CPU, the ROM, the RAM and the like, encodes, by a predetermined encoding method, the addition result between the digital high-resolution data subjected to the signal processing to be supplied from the calculation unit 310, namely, the component equal to or lower than the audible band of the digital high-resolution data and the very high frequency component of the digital high-resolution data subjected to the signal processing obtained by reducing the component equal to or lower than the audible band. The encoder 311 supplies the encoded data obtained by the encoding to the transmission unit 312.

The transmission unit 312, constituted of, for example, the CPU, the ROM, the RAM and the like, transmits the encoded data to be supplied from the encoder 311 by a predetermined communication method. This communication method may be wire communication or wireless communication. For example, in the case of the wire communication, the transmission unit 312 is connected to a receiver of a communication party by a predetermined communication cable and the like. Moreover, in the case of the wireless communication such as Bluetooth (registered trademark) and WiFi (registered trademark), the transmission unit 312 has a predetermined antenna and transmits the encoded data through the antenna as a wireless signal.

Figure 10:
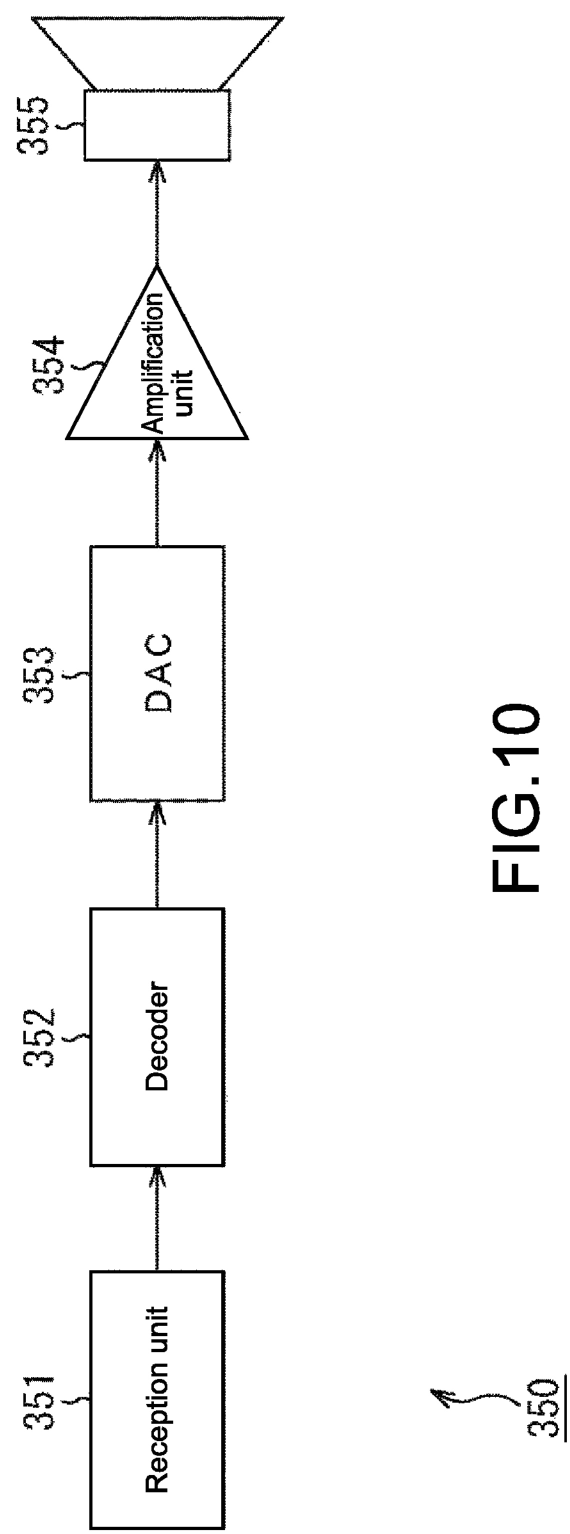
FIG. 10 is a block diagram showing a main configuration example of a receiver.

FIG. 10 is a block diagram showing a main configuration example of the receiver corresponding to this transmitter 300. A receiver 350 shown in FIG. 10 is an apparatus which receives and decodes the encoded data transmitted from the transmitter 300 and reproduces and outputs the obtained high-resolution data.

As shown in FIG. 10, the receiver 350 includes a reception unit 351, a decoder 352, a DAC 353, an amplification unit 354, and a speaker 355.

The reception unit 351 corresponds to the transmission unit 312 of the transmitter 300 and receives and demodulates the encoded data transmitted from the transmitter 300 by a communication method similar to that of the transmission unit 312. This communication method may be wire communication or wireless communication. For example, in the case of the wire communication, the reception unit 351 is connected to the transmitter 300 of a communication party by a predetermined communication cable and the like. Moreover, in the case of the wireless communication, the reception unit 351 has a predetermined antenna and receives the encoded data transmitted through the antenna as a wireless signal. The reception unit 351 supplies the received encoded data to the decoder 352.

The decoder 352 decodes the supplied encoded data by a decoding method corresponding to the encoding method of the encoder 311 of the transmitter 300 and obtains the digital high-resolution data. This digital high-resolution data is data subjected to signal processing to reduce the very high frequency stationary noise in the transmitter 300. The decoder 352 supplies the obtained digital high-resolution data to the DAC 353.

The DAC 353, the amplification unit 354, and the speaker 355 are processing units similar to those of the DAC 211, the amplification unit 212, and the speaker 213 and perform similar processing.

As described above, the transmitter 300 performs the signal processing to which the present technology is applied on the digital high-resolution data, encodes and transmits the data to the receiver 350. Subsequently, the receiver 350 decodes, reproduces, and outputs the data.

This allows the transmitter 300 and the receiver 350 to reproduce the audio data including the very high frequency more securely while suppressing reduction in audio quality.

Moreover, since the signal processing to which the present technology is applied is performed at the time of encoding as in the transmitter 300, an unnecessary energy component (noise) of the very high frequency can be suppressed and encoded, so that encoding efficiency can be improved.

It should be noted that in other words, the above described signal processing to which the present technology is applied can be executed at an arbitrary timing other than the time of reproducing and outputting the high-resolution data. Namely, the present technology can also be applied to a signal processing apparatus other than the reproduction apparatus.

For example, although it has been described that the encoded high-resolution data after encoding is transmitted to the receiver 350 and is reproduced and outputted in FIG. 9, the encoded high-resolution data is not limited to this. The encoded data may be stored in a predetermined storage unit and the like, may be subjected to other signal processing or may be edited. Moreover, the high-resolution data is subjected to only signal processing without encoding, and the high-resolution data subjected to the signal processing may be stored in a predetermined storage unit and the like, may be subjected to other signal processing or may be edited. Moreover, it may be configured such that the encoded data and the high-resolution data subjected to the signal processing are transmitted to other apparatus and these processing is executed by the other apparatus.

4. Fourth Embodiment

<Volume Control at the Time of Reproducing>

Figure 11:
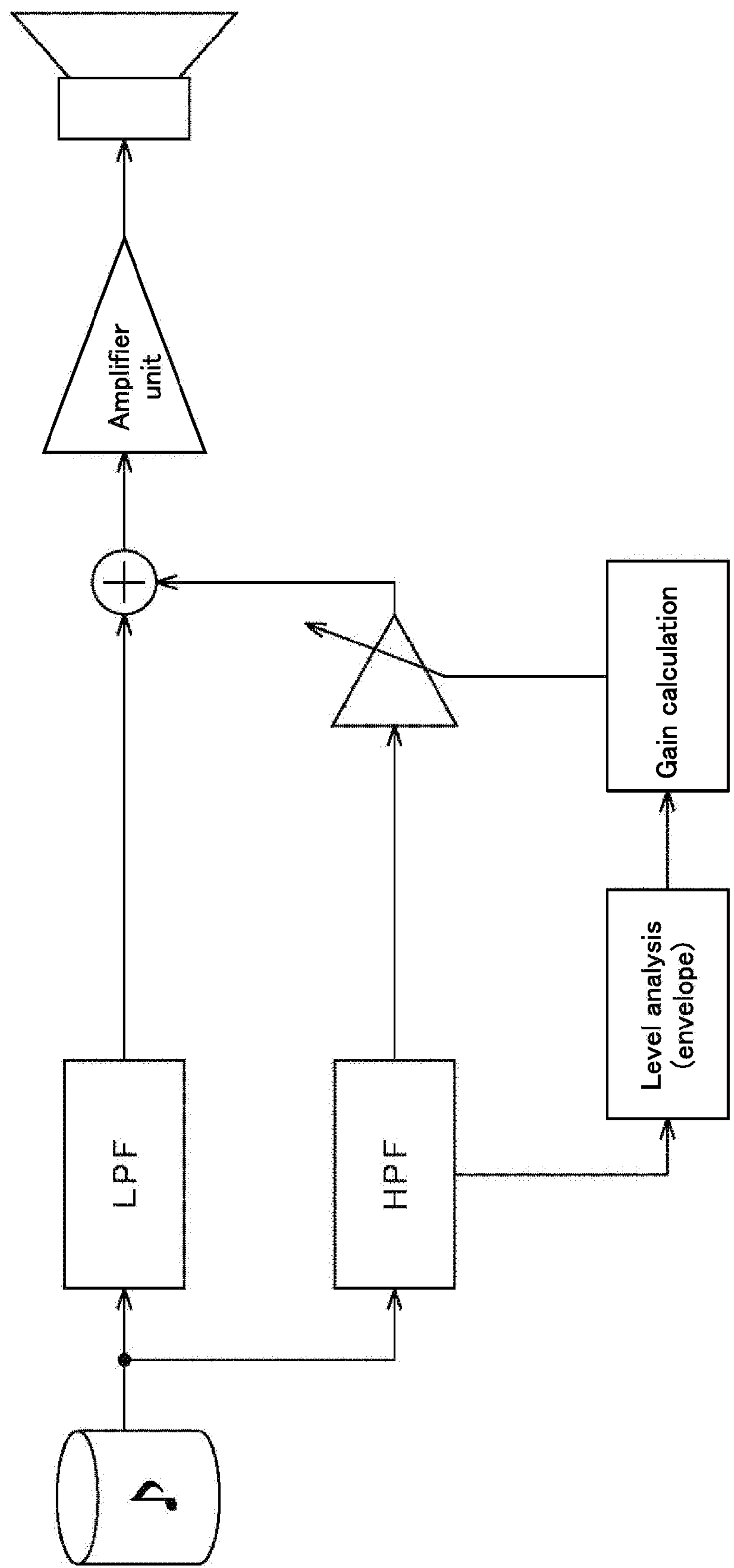
FIG. 11 is a diagram describing an example of a band-based compressor.

Meanwhile, as a method for protecting an amplifier and a speaker in the reproduction of the high-resolution data, a method of suppressing gain to only the very high frequency is conceivable by using a multiband compressor as shown in FIG. 11 to perform a level analysis and gain control processing on only the very high frequency.

However, this method makes a compressor operation constant irrespective of noise characteristic such as a noise curve shape by a noise shaper. Moreover, processing is determined by a signal level in a digital region, which does not consider a volume of an apparatus. That is, even in the case of small volume reproduction, the compressor suppresses a noise shaper noise of a relatively high level with respect to a full scale level of the digital. Further, the level analysis is necessary all the time, which takes calculation resources such as the CPU, the MPU, or the DSP, thereby increasing power consumption.

Then, it may be configured to include the transform unit configured to orthogonally transform an audio signal, the analysis unit configured to analyze the audio signal orthogonally transformed by the transform unit and estimate the very high frequency stationary signal component, a signal processing unit configured to perform signal processing to reduce the very high frequency stationary signal component estimated by the analysis of the analysis unit with respect to the audio signal, in which the signal processing unit reduces the very high frequency stationary signal component in accordance with an amplification amount of the audio signal.

<Reproduction Apparatus>

Figure 12:
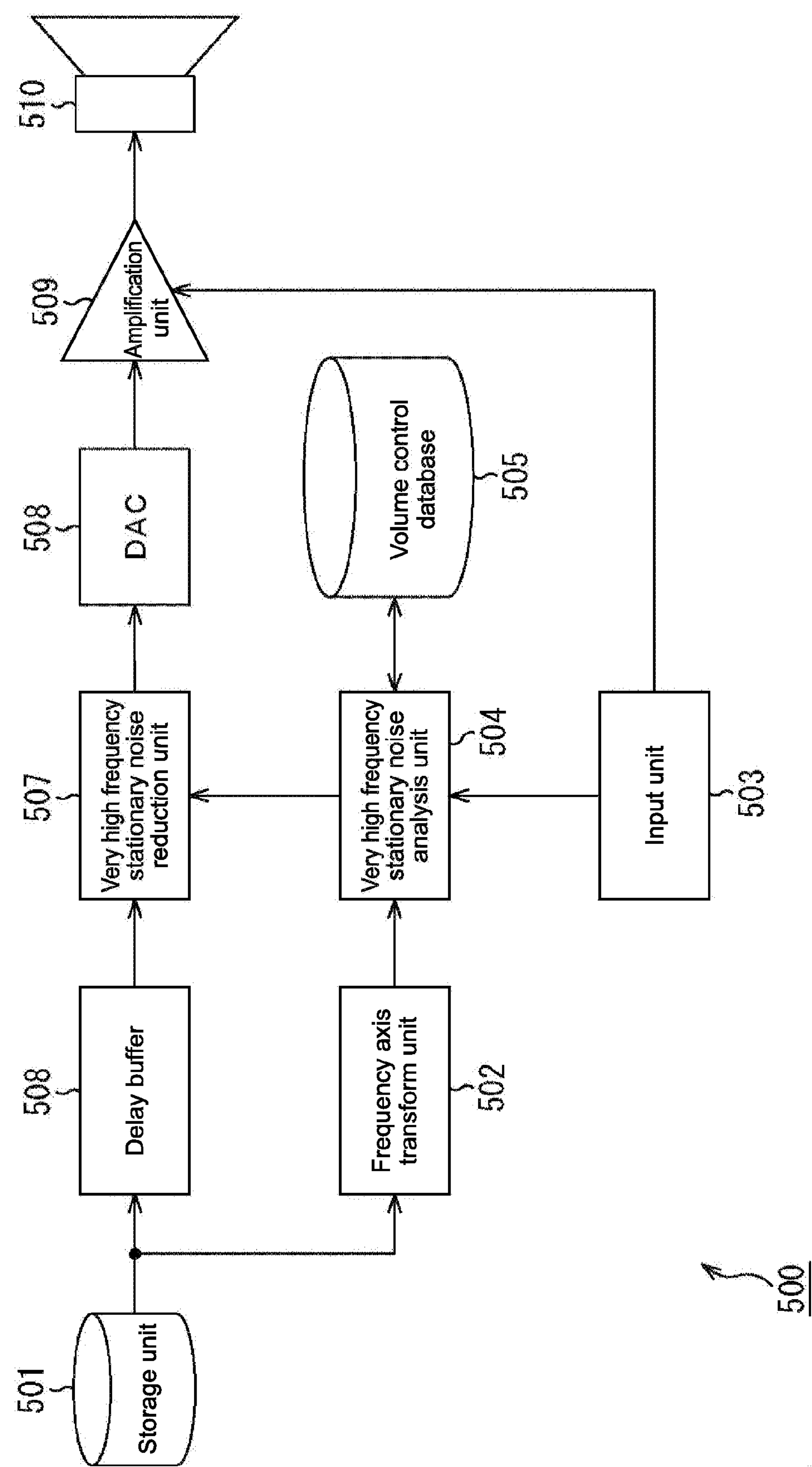
FIG. 12 is a block diagram showing a main configuration example of the reproduction apparatus.

FIG. 12 is a block diagram showing a main configuration example of the reproduction apparatus according to an embodiment of the signal processing apparatus to which the present technology is applied. A reproduction apparatus 500 shown in FIG. 12 is an apparatus which reproduces and outputs the high-resolution data (audio data).

As shown in FIG. 12, the reproduction apparatus 500 includes a storage unit 501, a frequency axis transform unit 502, an input unit 503, a very high frequency stationary noise analysis unit 504, a volume control database 505, a delay buffer 506, a very high frequency stationary noise reduction unit 507, a DAC 508, an amplification unit 509, and a speaker 510.

The storage unit 501 is a storage unit similar to the storage unit 101 of the reproduction apparatus 100 and stores the digital high-resolution data. The digital high-resolution data to be reproduced is read from the storage unit 501 and is supplied to the frequency axis transform unit 502 and the delay buffer 506.

The frequency axis transform unit 502 is a processing unit similar to the frequency axis transform unit 102 of the reproduction apparatus 100 and performs a Fourier transform on the digital high-resolution data supplied and supplies the frequency spectra to the very high frequency stationary noise analysis unit 504.

The input unit 503 receives information instructed by an input operation of a user and information supplied from other apparatus such as a remote controller operated by the user and the like. For example, the input unit 503 receives a volume setting supplied therefrom. The input unit 503 supplies the inputted volume setting to the very high frequency stationary noise analysis unit 504 and the amplification unit 509.

The very high frequency stationary noise analysis unit 504, constituted of, for example, the CPU, the ROM, the RAM and the like, analyzes the frequency spectra supplied from the frequency axis transform unit 502 and estimates the very high frequency stationary noise as with the case of the very high frequency stationary noise analysis unit 103 of the reproduction apparatus 100. Moreover, the very high frequency stationary noise analysis unit 504 has information about hardware specifications such as the amplification unit 509 and the speaker 510 (hereinafter also referred to as hardware information) and sets a value of a control parameter of filter processing for suppressing the very high frequency component by the very high frequency stationary noise reduction unit 507 for each volume setting based on the hardware information. The very high frequency stationary noise analysis unit 504 supplies the value to the volume control database 505.

The volume control database 505 has an arbitrary recording medium such as a hard disk, a flash memory or an optical disk and stores each volume setting and the value of the control parameter corresponding thereto while retaining the relationship between them, as a volume control database.

When the digital high-resolution data is reproduced and outputted, the very high frequency stationary noise analysis unit 504 supplies the volume setting supplied from the input unit 503 to the volume control database 505. The volume control database 505 supplies the value of the control parameter corresponding to the volume setting to the very high frequency stationary noise analysis unit 504 in accordance with the request of the very high frequency stationary noise analysis unit 504. The very high frequency stationary noise analysis unit 504 supplies the value of the control parameter corresponding to the volume setting supplied from the input unit 503 to the very high frequency stationary noise reduction unit 507.

To complete the foregoing analysis before the signal processing, the delay buffer 506 temporarily retains the supplied digital high-resolution data and delays a reproducing timing. After retaining the digital high-resolution data for a predetermined time, the delay buffer 506 supplies the data to the very high frequency stationary noise reduction unit 507.

The very high frequency stationary noise reduction unit 507, constituted of, for example, the CPU, the ROM, the RAM and the like, uses the value of the control parameter supplied from the very high frequency stationary noise analysis unit 103 to perform filter processing on the very high frequency of the digital high-resolution data supplied from the delay buffer 506 and reduce the very high frequency stationary noise included in the digital high-resolution data. A predetermined control parameter of the filter processing is variable. As described above, the very high frequency stationary noise analysis unit 504 sets the value of the control parameter in accordance with the volume setting received in the input unit 503. Therefore, the very high frequency stationary noise reduction unit 507 can apply a value in accordance with the volume setting received in the input unit 503 to the control parameter. Namely, the very high frequency stationary noise reduction unit 507 can perform filter processing in accordance with the volume setting received in the input unit 503. The very high frequency stationary noise reduction unit 507 supplies, to the DAC 508, the digital high-resolution data subjected to the filter processing.

The DAC 508 performs D/A conversion on the digital high-resolution data to be supplied and supplied it to the amplification unit 509 as a sound signal of an analog signal (hereinafter also referred to as audio signal). The amplification unit 509 amplifies the audio signal to be supplied from the DAC 508 by a gain in accordance with the volume setting supplied from the input unit 503 and supplies the signal to the speaker 510. The speaker 510 converts the audio signal to be supplied into a physical vibration and outputs it as sound such as voice and music.

<Flow of Reproduction Processing>

Processing executed by the reproduction apparatus 500 configured as described above will be described. First, referring to a flowchart in FIG. 13, an example of a flow of reproduction processing executed by the reproduction apparatus 500 will be described.

Upon start of the reproduction processing, the frequency axis transform unit 502, the very high frequency stationary noise analysis unit 504 and the volume control database 505 analyze very high frequency stationary noise included in the digital high-resolution data to be reproduced, in step S501. The details of the reproduction processing will be described later, but this processing generates a correspondence table between the volume setting and the value of the control parameter of the filter processing by the very high frequency stationary noise reduction unit 507 as a volume control database.

In step S502, the delay buffer 506 reads the digital high-resolution data to be reproduced from the storage unit 501. The delay buffer 506 temporarily retains the read digital high-resolution data and delays it until the processing is completed in step S501.

After the processing is completed in step S501, the input unit 503 receives the volume setting in step S503. In step S504, the very high frequency stationary noise analysis unit 504 references the volume control database 505 and sets the control parameter in accordance with the volume setting received in step S503.

In step S505, the very high frequency stationary noise reduction unit 507 uses the control parameter set in step S504 to perform filter processing on the very high frequency of the digital high-resolution data. Namely, the very high frequency stationary noise reduction unit 507 mainly performs filter processing for reducing the very high frequency to reduce a very high frequency stationary noise component.

Figure 14:
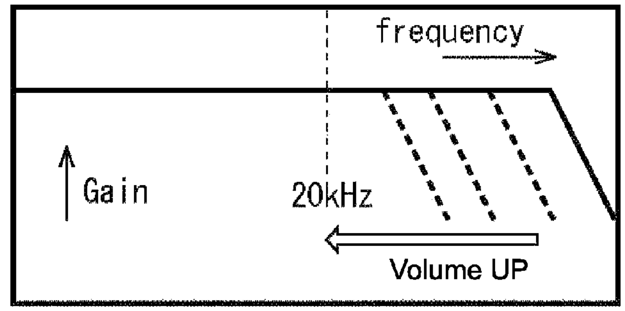
FIG. 14 is a diagram describing an example of control.
Figure 14:
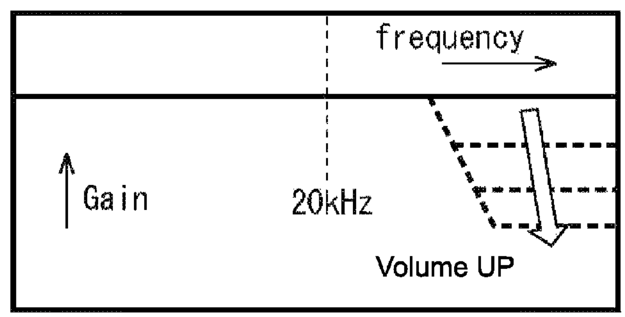
Figure 14:
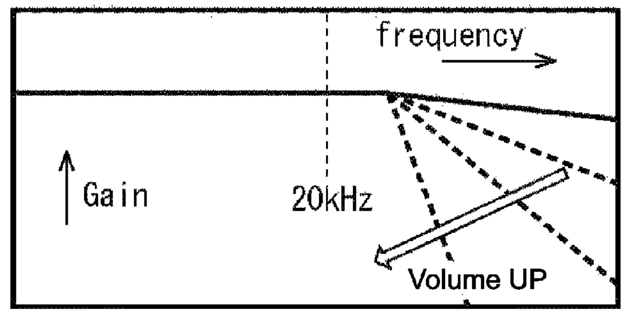

This filter processing and the control parameter are arbitrary. For example, the filter processing may be performed with use of a low-pass filter (LPF) to reduce the very high frequency. In that case, the control parameter for changing a value in accordance with the volume setting may be a cut-off frequency (fc), for example. For example, as shown in A of FIG. 14, the control parameter may be configured such that the cut-off frequency (fc) decreases (close to the upper limit of an audible band (for example, 20 kHz)) as the volume setting (volume) increases and the cut-off frequency (fc) increases (further from the upper limit of an audible band (for example, 20 kHz)) as the volume setting (volume) decreases.

Moreover, the control parameter for changing a value in accordance with the volume setting may be an inclination (steepness of cut and gain), for example. For example, as shown in B of FIG. 14, the control parameter may be configured such that an inclination in a band equal to or higher than the cut-off frequency (fc) increases (gain decreases) as the volume setting (volume) increases and the inclination in the band equal to or higher than the cut-off frequency (fc) decreases (gain increases) as the volume setting (volume) decreases.

Moreover, the filter processing may be performed with use of a treble shelving filter (TSF) to reduce the very high frequency. In that case, the control parameter for changing a value in accordance with the volume setting may be a gain (inclination (steepness of cut)), for example. For example, as shown in C of FIG. 14, the control parameter may be configured such that an angle of the inclination (steepness of cut) in the band equal to or higher than the cut-off frequency (fc) increases (gain decreases) as the volume setting (volume) increases and the angle of the inclination (steepness of cut) in the band equal to or higher than the cut-off frequency (fc) decreases (gain increases) as the volume setting (volume) decreases.

Figure 15:
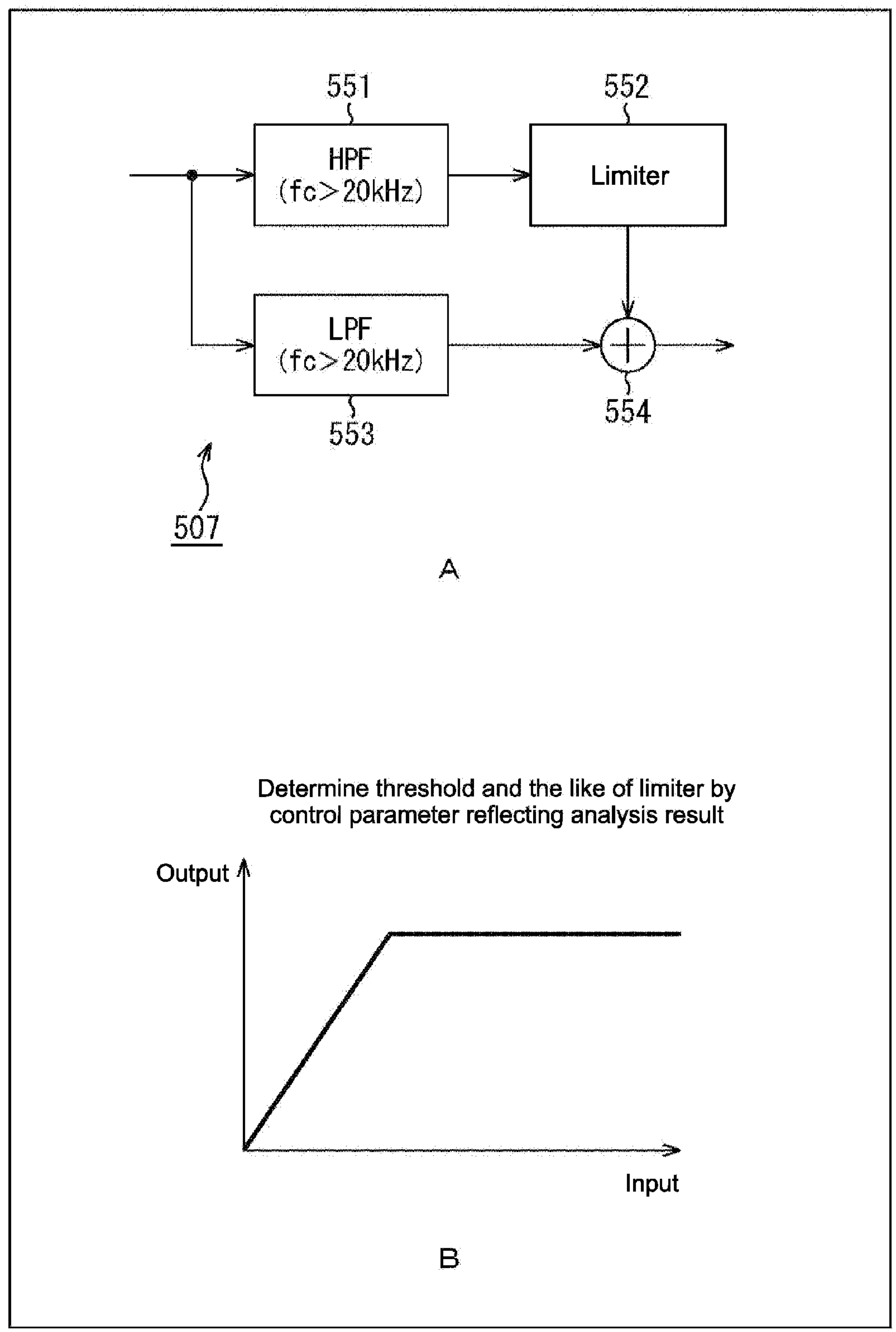
FIG. 15 is a diagram describing an example of the control.

Moreover, as shown in A of FIG. 15, a limiter may be used to perform filter processing to reduce the very high frequency. In the case of an example shown in A of FIG. 15, the very high frequency stationary noise reduction unit 507 includes an HPF 551, a limiter 552, and an LPF 553, and a calculation unit 554.

The HPF 511 extracts a component of the very high frequency (for example, 20 kHz or more) from the supplied high-resolution data and supplies it to the limiter 552. The limiter 552 has a predetermined input/output characteristic as the case shown in B of FIG. 15 and outputs an input signal level suppressed to a predetermined signal level when the input signal level is equal to or higher than a predetermined threshold. The limiter 552 performs such signal level control on the very high frequency component of the supplied high-resolution data and supplies it to the calculation unit 554.

The LPF 553 extracts a component equal to or lower than the audible band (for example, 20 kHz or less) from the supplied high-resolution data and supplies it to the calculation unit 554. The calculation unit 554 adds (synthesizes) the high-resolution data supplied from the LPF 553 and the high-resolution data supplied from the limiter 552 and outputs the addition result (synthesis result), namely, the high-resolution data of all bands. This high-resolution data suppresses its very high frequency by the limiter 552 as appropriate.

In this case, the control parameter for changing a value in accordance with the volume setting may be the threshold of the input/output characteristic of the limiter 552, for example. For example, it may be configured such that a value of the threshold decreases as the volume setting (volume) increases and the value of the threshold increases as the volume setting (volume) decreases.

It is obvious that the filter processing to suppress the very high frequency and the control parameter for changing a value in accordance with the volume setting may be other than that described above.

Referring back to FIG. 13, in step S506, the DAC 508 performs D/A conversion on the digital high-resolution data subjected to the filter processing in step S505 and generates an analog audio signal.

In step S507, the amplification unit 509 amplifies the audio signal by the gain in accordance with the volume setting received in step S503.

In step S508, the speaker 510 outputs the audio signal as sound.

Upon completion of the processing of step S510, the reproduction processing is completed.

<Flow of Analysis Processing>

Next, referring to a flowchart in FIG. 16, an example of a flow of analysis processing executed in step S501 of FIG. 13 will be described. Description will be made with reference to FIG. 17, as appropriate.

Upon start of the analysis processing, the frequency axis transform unit 502 reads the digital high-resolution data to be reproduced from the storage unit 501 in step S511. In step S512, the frequency axis transform unit 502 performs a Fourier transform on the read digital high-resolution data.

In step S513, the very high frequency stationary noise analysis unit 503 performs smoothing on the frequency axis.

In step S514, the very high frequency stationary noise analysis unit 504 uses a very high frequency component of frequency axis data (frequency spectrum) at a plurality of times obtained as described above to estimate the very high frequency stationary noise.

In step S515, the very high frequency stationary noise analysis unit 504 further calculates a level margin of the very high frequency with respect to the very high frequency stationary noise estimated based on hardware information of the reproduction apparatus 500 such as the amplification unit 509 and the speaker 510.

In step S516, the very high frequency stationary noise analysis unit 504 sets the value of the control parameter of the filter processing by the very high frequency stationary noise reduction unit 507 corresponding to each volume setting, for example, as shown in FIG. 17, based on the level margin calculated in step S515.

FIG. 17 shows an example in which a value of a variable control parameter is set in accordance with the volume setting as in paramA0, paramB0, . . . ; paramB1, paramB1, . . . ; paramA2, paramB2, . . . ; . . . ; paramA28, paramB28, . . . ; paramA29, paramB29, . . . ; paramA30, paramB30, . . . ; to each volume setting of Volume0; Volume1; Volume2; . . . ; Volume28; Volume29; Volume30, respectively. Upon generation of a correspondence table between such volume setting and control parameter, the processing proceeds to step S517.

In step S517, the volume control database 505 stores the value of the control parameter for each volume setting generated in step S516 as a volume control database. Upon completion of the processing of step S517, the processing returns to FIG. 13.

Figure 13:
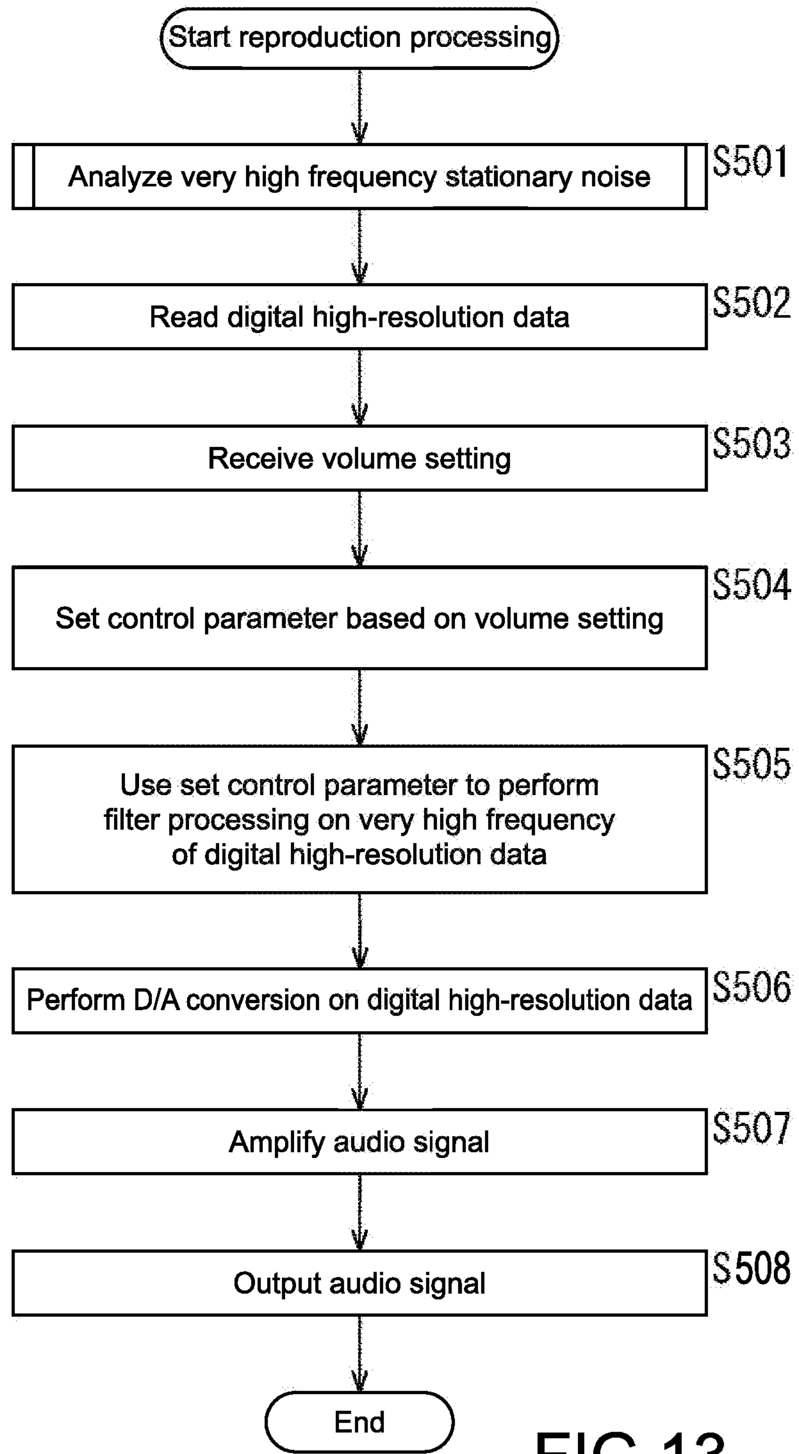
FIG. 13 is a flowchart describing an example of a flow of the reproduction processing.

The very high frequency stationary noise analysis unit 504 uses the volume control database generated as described above to determine the value of the control parameter in accordance with the volume setting received in the input unit 503 and supplies the control parameter to the very high frequency stationary noise reduction unit 507 as described by referring to the flowchart in FIG. 13. Subsequently, the very high frequency stationary noise reduction unit 507 uses the control parameter to perform filter processing, thereby appropriately reducing the very high frequency component of the digital high-resolution data to be reproduced in accordance with the volume setting.

Therefore, the reproduction apparatus 500 can amplifies and outputs the audio signal whose very high frequency is reduced if necessary (if overloading a speaker and an amplifier is a problem), so that an excessive load applied to the speaker and the amplifier due to an excessive sound pressure of the very high frequency noise can be suppressed. That is, it is possible to reproduce audio data including the very high frequency more securely. Moreover, unnecessary reduction can be suppressed in the very high frequency, so that the reproduction apparatus 500 can reproduce while suppressing reduction in audio quality.

That is, in this case as well, the signal processing apparatus to which the present technology is applied can reproduce the audio data including the very high frequency more securely while suppressing reduction in audio quality similar to the reproduction apparatus 500.

It should be noted that in this case as well, the very high frequency stationary noise reduction unit 507 may perform filter processing (spectral subtraction and Wiener filter) similar to that of the reproduction apparatus 100 according to the first embodiment and mainly suppress originally unnecessary very high frequency stationary noise. That is, the value of the control parameter of the filter processing (spectral subtraction and Wiener filter) similar to that of the reproduction apparatus 100 according to the first embodiment can be controlled in accordance with the volume setting.

<Flow of Analysis Processing>

Moreover, in this case as well, the stationary signal component may be a component without including a harmonic component of a signal component of an audible band. That is, the harmonic component of the signal component of the audible band may be removed from the noise to be estimated.

Figure 18:
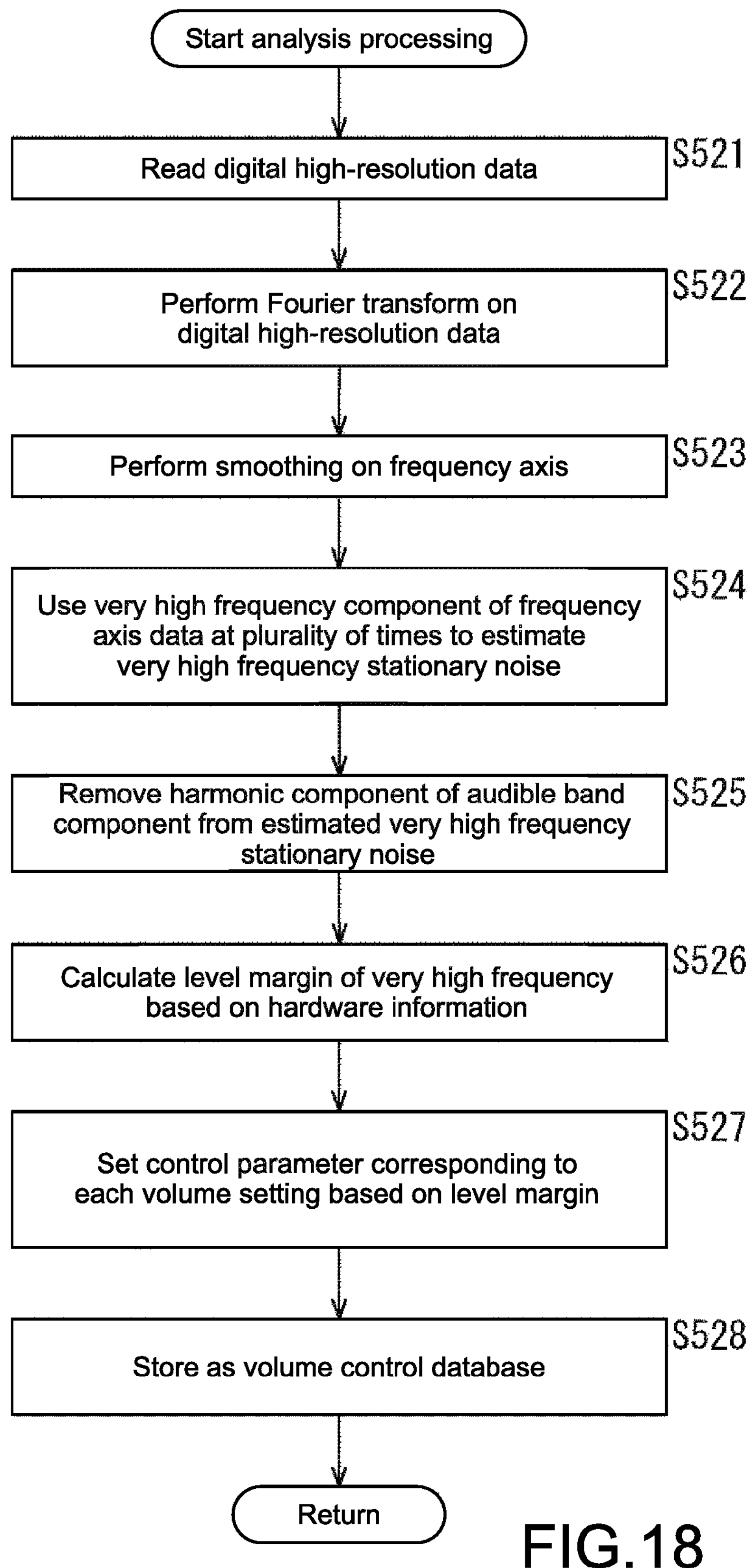
FIG. 18 is a flowchart describing an example of a flow of the analysis processing.

Referring to a flowchart in FIG. 18, an example of a flow of analysis processing in that case will be described. As shown in the flowchart in FIG. 18, in this case as well, each processing of step S521 to step S524 is executed similar to each processing of step S511 to step S514 in the case of FIG. 16. That is, as with the case of FIG. 16, the very high frequency stationary noise is estimated.

Upon estimation of the very high frequency stationary noise, in step S525, the very high frequency stationary noise analysis unit 504 removes the harmonic component of the signal component of the audible band from the very high frequency stationary noise estimated in step S524.

In step S526, the very high frequency stationary noise analysis unit 504 calculates a level margin of the very high frequency with respect to the very high frequency stationary noise whose harmonic component of the signal component of the audible band is reduced based on hardware information of the reproduction apparatus 500 such as the amplification unit 509 and the speaker 510.

Figure 16:
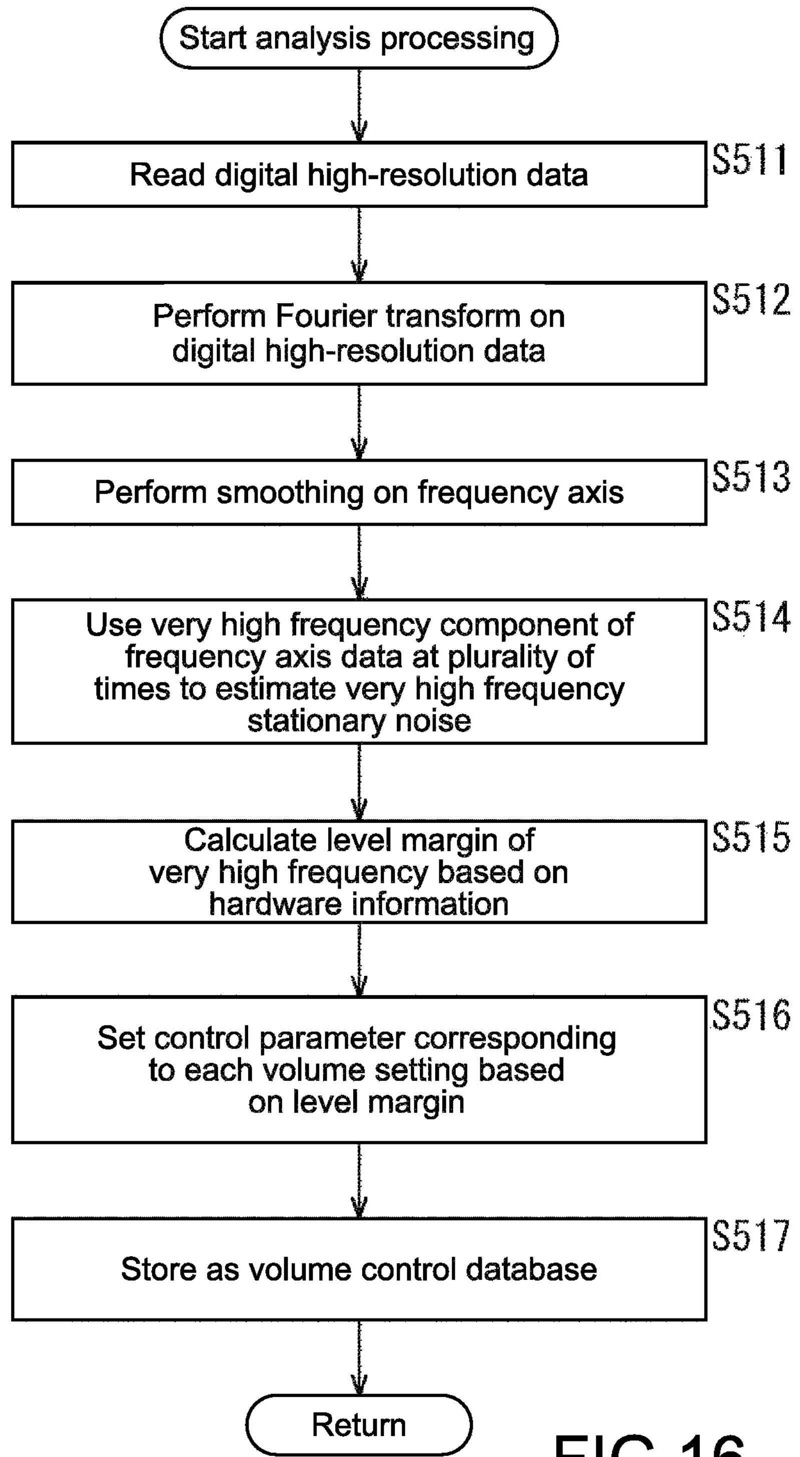
FIG. 16 is a flowchart describing an example of a flow of the analysis processing.

Each processing of step S527 and step S528 is executed similar to each processing of step S516 and step S517 in the case of FIG. 16.

Upon completion of the processing of step S528, the analysis processing is completed and the processing returns to FIG. 13.

The very high frequency stationary noise reduction unit 507 uses the foregoing analysis result to perform signal processing, thereby enabling reduction in the very high frequency based on the volume setting of the very high frequency stationary noise without including the harmonic component of the signal component of the audible band. The harmonic component of the signal component of the audible band basically changes in time and is unstationary, so that the load applied to the reproduction apparatus is also less than the stationary noise. Therefore, this allows the reproduction apparatus 500 (signal processing apparatus to which the present technology is applied) to further suppress the unnecessary reduction in the very high frequency and the reduction in the audio quality in reproduction of the high-resolution data.

<Analysis Timing>

It should be noted that in the case of the present embodiment as well, the analysis of the very high frequency stationary noise (estimation of the very high frequency stationary noise) may be performed at any timing as long as the analysis is performed prior to a timing of reproduction and output of the digital high-resolution data as with the case of the first embodiment (example shown in FIG. 7). Moreover, since it is sufficient to estimate the stationary noise, not all the high-resolution data need be used for the analysis as with the case of the first embodiment (example shown in FIG. 7). The analysis may be performed by using only a part of the high-resolution data (partial data corresponding to a predetermined part of a reproduction time (for example, partial data corresponding to a predetermined time from an initial point or intermediate point)).

It is obvious that the analysis may be performed irrespective of the reproduction of the high-resolution data as long as the analysis is performed in a timing prior to the reproduction timing of the high-resolution data. For example, when the storage unit 501 stores the high-resolution data, the analysis may be performed. This case eliminates the necessity to delay the reproduction timing so that the reproduction timing is matched with an analysis timing, thereby allowing for omitting the delay buffer 506.

The foregoing analysis can suppress the load of the processing and an increase in power consumption in accordance with the analysis.

5. Fifth Embodiment

<Computer>

The series of processing described above can be executed by hardware but can also be executed by software. When the series of processing is executed by software, a program that configures such software is installed into a computer. Here, the computer includes a computer in which dedicated hardware is incorporated and a general-purpose personal computer or the like that is capable of executing various functions when various programs are installed.

Figure 19:
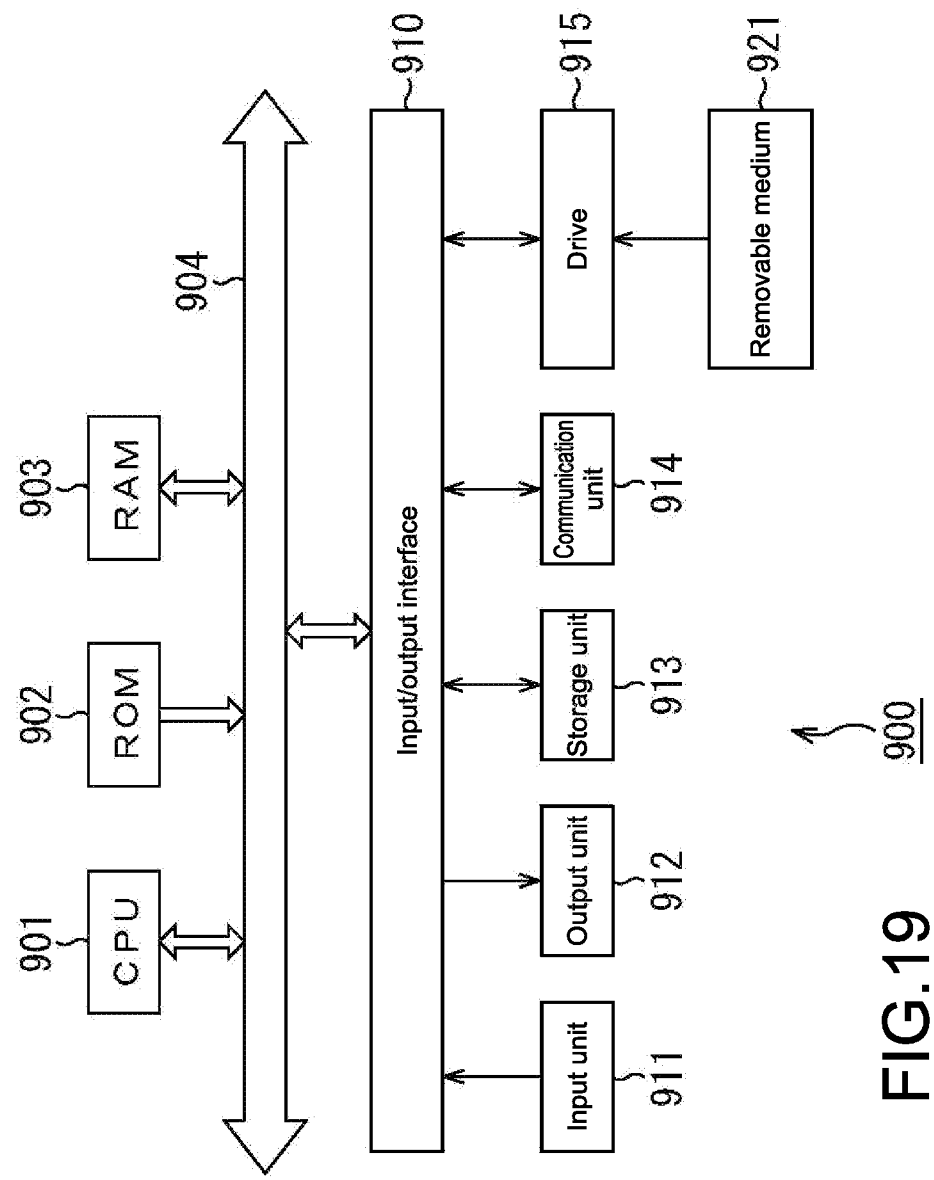
FIG. 19 is a block diagram showing a main configuration example of a computer.

FIG. 19 is a block diagram showing an example configuration of the hardware of a computer that executes the series of processing described above according to a program.

In a computer 900 shown in FIG. 19, a central processing unit (CPU) 901, a read only memory (ROM) 902 and a random access memory (RAM) 903 are mutually connected through a bus 904.

An input/output interface 910 is also connected to the bus 904. An input unit 911, an output unit 912, a storage unit 913, a communication unit 914, and a drive 915 are connected to the input/output interface 910.

The input unit 911 is configured from a keyboard, a mouse, a microphone, a touch panel, an input terminal, and the like. The output unit 912 is configured from a display, a speaker, an input terminal, and the like. The storage unit 913 is configured from a hard disk, a RAM disk, a non-volatile memory, and the like. The communication unit 914 is configured from a network interface and the like. The drive 915 drives a removable medium 921 such as a magnetic disk, an optical disk, a magneto-optical disk, and a semiconductor memory.

In the computer configured as described above, the CPU 901 loads a program that is stored, for example, in the storage unit 913 onto the RAM 903 through the input/output interface 910 and the bus 904, and executes the program. Therefore, the above-described series of processing is performed. The RAM 903 stores data in a suitable manner, which is necessary for the CPU 901 to execute various processing.

A program executed by the computer (CPU 901) may be recorded in the removable medium 921 as a package medium or the like, for example, and may be applied. In that case, by mounting the removable medium 921 on the drive 915, the program can be installed into the storage unit 913 through the input/output interface 910.

Moreover, the program may be provided through a wired or wireless transmission medium, such as a local area network, the Internet or digital satellite broadcasting. In that case, the communication unit 914 may receive the program, and the program may be installed in the storage 913.

As another alternative, the program can be installed in advance into the ROM 902 or the storage unit 913.

It should be noted that the program executed by a computer may be a program that is processed in time series according to the sequence described in this specification or a program that is processed in parallel or at necessary timing such as upon calling.

Moreover, in this specification, the steps describing the program stored in the recording medium include not only processing performed in time series according to the sequence shown therein but also processing executed in parallel or individually, not necessarily performed in time series.

Moreover, in the present specification, a system has the meaning of a set of a plurality of configured elements (such as an apparatus or a module (part)), and does not take into account whether or not all the configured elements are in the same casing. Therefore, the system may be either a plurality of apparatuses stored in separate casings and connected through a network, or a single apparatus stored in a plurality of modules within a single casing.

Moreover, an element described as a single apparatus (or processing unit) above may be configured to be divided as a plurality of apparatuses (or processing units). On the contrary, elements described as a plurality of apparatuses (or processing units) above may be configured collectively as a single apparatus (or processing unit). Moreover, an element other than those described above may be added to each apparatus (or processing unit). Further, a part of an element of a given apparatus (or processing unit) may be included in an element of another apparatus (or another processing unit) as long as the configuration or operation of the system as a whole is substantially the same.

The suitable embodiments of the present disclosure have been described above in detail with reference to the attached drawings.

The technical scope of the present disclosure is not limited to those examples. It should be understood by those skilled in the art that various modifications, combinations, sub-combinations and alterations may occur depending on design requirements and other factors insofar as they are within the scope of the appended claims or the equivalents thereof.

For example, the present technology may employ a configuration of cloud computing, in which a plurality of apparatuses share one function and process the function together through a network.

Moreover, one apparatus may execute the steps described with reference to the flowcharts, or a plurality of apparatuses may share and execute the steps.

Further, in a case where one step includes a plurality of processing, one apparatus may execute the plurality of processing in the step, or a plurality of apparatuses may share and execute the plurality of processing.

It should be noted that the present technology may also be configured as follows:

(1) A signal processing apparatus including a transform unit configured to orthogonally transform an audio signal; an analysis unit configured to analyze the audio signal orthogonally transformed by the transform unit and estimate a very high frequency stationary signal component; and a signal processing unit configured to perform signal processing to reduce the very high frequency stationary signal component estimated by the analysis of the analysis unit with respect to the audio signal.

(2) The signal processing apparatus according to any one of Items (1) and (3) to (19), in which the very high frequency is higher-frequency than an audible band.

(3) The signal processing apparatus according to any one of Items (1), (2) and (4) to (19), in which the stationary signal component is a component which increases a level toward the high frequency.

(4) The signal processing apparatus according to any one of Items (1) to (3) and (5) to (19), in which the stationary signal component is a component without including a harmonic component of a signal component of an audible band.

(5) The signal processing apparatus according to any one of Items (1) to (4) and (6) to (19), in which the signal processing unit reduces the very high frequency stationary signal component by a spectral subtraction.

(6) The signal processing apparatus according to any one of Items (1) to (5) and (7) to (19), in which the signal processing unit reduces the very high frequency stationary signal component by a Wiener filter.

(7) The information processing apparatus according to any one of Items (1) to (6) and (8) to (19), in which the transform unit performs a fast Fourier transform on the audio signal.

(8) The signal processing apparatus according to any one of Items (1) to (7) and (9) to (19) further including a band division unit configured to band-divide the audio signal into the very high frequency signal component and a signal component other than the very high frequency; and a synthesis unit configured to synthesize the audio signal whose very high frequency stationary signal component is reduced by the signal processing unit and a signal component other than the very high frequency of the audio signal obtained by the band division unit band-dividing the audio signal, in which the transform unit orthogonally transforms the very high frequency signal component of the audio signal obtained by the band division unit band-dividing the audio signal, the analysis unit analyzes the very high frequency signal component of the audio signal orthogonally transformed by the transform unit and estimates the very high frequency stationary signal component, the signal processing unit performs signal processing to reduce the very high frequency stationary signal component estimated by the analysis of the analysis unit with respect to the very high frequency signal component of the audio signal obtained by the band division unit band-dividing the audio signal, and the synthesis unit synthesizes the very high frequency signal component of the audio signal whose very high frequency stationary signal component is reduced by the signal processing unit and the signal component other than the very high frequency of the audio signal obtained by the band division unit band-dividing the audio signal.

(9) The signal processing apparatus according to any one of Items (1) to (8) and (10) to (19), in which the band division unit includes a high-pass filter configured to extract the very high frequency signal component from the audio signal and a low-pass filter configured to extract the signal component other than the very high frequency from the audio signal.

(10) The signal processing apparatus according to any one of Items (1) to (9) and (11) to (19), further including a high-pass filter configured to remove the signal component other than the very high frequency from the audio signal whose very high frequency stationary signal component is reduced by the signal processing unit, in which the synthesis unit synthesizes the audio signal whose signal component other than the very high frequency is removed by the high-pass filter and the signal component other than the very high frequency of the audio signal obtained by the band division unit band-dividing the audio signal.

(11) The signal processing apparatus according to any one of Items (1) to (10) and (12) to (19), in which the signal processing unit reduces the very high frequency stationary signal component in accordance with an amplification amount of the audio signal.

(12) The signal processing apparatus according to any one of Items (1) to (11) and (13) to (19), in which the signal processing unit reduces the very high frequency stationary signal component by a low-pass filter having a cut-off frequency in accordance with the amplification amount of the audio signal.

(13) The signal processing apparatus according to any one of Items (1) to (12) and (14) to (19), in which the signal processing unit reduces the very high frequency stationary signal component by a low-pass filter having a frequency characteristic of an inclination in accordance with the amplification amount of the audio signal in a band equal to or higher than a cut-off frequency.

(14) The signal processing apparatus according to any one of Items (1) to (13) and (15) to (19), in which the signal processing unit reduces the very high frequency stationary signal component by a treble shelving filter having a gain in accordance with the amplification amount of the audio signal.

(15) The signal processing apparatus according to any one of Items (1) to (14) and (16) to (19), in which the signal processing unit reduces the very high frequency stationary signal component by a limiter having a threshold in accordance with the amplification amount of the audio signal with respect to the very high frequency.

(16) The signal processing apparatus according to any one of Items (1) to (15) and (17) to (19), in which the analysis unit analyzes partial data of the audio signal, which corresponds to a predetermined partial time of a reproduction time of the audio signal, and estimates the very high frequency stationary signal component.

(17) The signal processing apparatus according to any one of Items (1) to (16), (18), and (19), in which the analysis unit analyzes partial data of the audio signal, which corresponds to an initial partial time of the reproduction time of the audio signal, and estimates the very high frequency stationary signal component.

(18) The signal processing apparatus according to any one of Items (1) to (17) and (19), in which the analysis unit analyzes partial data of the audio signal, which corresponds to an intermediate partial time of the reproduction time of the audio signal, and estimates the very high frequency stationary signal component, and the signal processing unit updates the stationary signal component to be reduced in accordance with a latest analysis result of the analysis unit only when necessary.

(19) The signal processing apparatus according to any one of Items (1) to (18) further including an encoder configured to encode the audio signal whose very high frequency stationary signal component is reduced by the signal processing unit.

(20) A signal processing method including orthogonally transforming an audio signal; analyzing the orthogonally transformed audio signal and estimating a very high frequency stationary signal component; and performing signal processing to reduce the estimated very high frequency stationary signal component with respect to the audio signal.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing apparatus, comprising:

a central processing unit (CPU) configured to:

band-divide an audio signal into a first signal component and a second signal component, wherein the first signal component comprises a first frequency greater than or equal to a first threshold and wherein the second signal component comprises a second frequency less than the first threshold;

orthogonally transform the first signal component;

analyze the orthogonally transformed first signal component;

estimate, based on the analysis of the orthogonally transformed first signal component, a stationary signal component of the first signal component, wherein the stationary signal component has a third frequency greater than the first threshold;

reduce the estimated stationary signal component based on the first signal component;

synthesize the reduced estimated stationary signal component and the second signal component to produce an enhanced audio signal; and output the enhanced audio signal through an audio output device.

2. The signal processing apparatus according to claim 1, wherein the first threshold corresponds to a fourth frequency higher than an audible band.

3. The signal processing apparatus according to claim 1, wherein the stationary signal component corresponds to a component that excludes a harmonic component of a third signal component of an audible band.

4. The signal processing apparatus according to claim 1, wherein the CPU is further configured to reduce the estimated stationary signal component based on a spectral subtraction.

5. The signal processing apparatus according to claim 1, wherein the CPU is further configured to reduce the estimated stationary signal component based on a Wiener filter.

6. The signal processing apparatus according to claim 1, wherein the CPU is further configured to fast Fourier transform the audio signal.

7. The signal processing apparatus according to claim 1, further comprising:

a high-pass filter configured to extract the first signal component from the audio signal, and a low-pass filter configured to extract the second signal component from the audio signal.

8. The signal processing apparatus according to claim 1, further comprising:

a high-pass filter configured to remove the second signal component from the audio signal, which includes the reduced estimated stationary signal component, to obtain a filtered audio signal, wherein the CPU is further configured to synthesize the filtered audio signal and the second signal component.

9. The signal processing apparatus according to claim 1, wherein the CPU is further configured to reduce the estimated stationary signal component based on a low-pass filter, wherein the low-pass filter has an inclination of a frequency characteristic in a band equal to or greater than a cut-off frequency, and wherein the inclination of the frequency characteristic is based on an amplification amount of the audio signal.

10. The signal processing apparatus according to claim 1, wherein the CPU is further configured to reduce the estimated stationary signal component based on a treble shelving filter, wherein a gain of the treble shelving filter is based on an amplification amount of the audio signal.

11. The signal processing apparatus according to claim 1, wherein the CPU is further configured to reduce the estimated stationary signal component based on a limiter, wherein the limiter has a second threshold based on an amplification amount of the audio signal.

12. The signal processing apparatus according to claim 1, wherein the CPU is further configured to estimate the stationary signal component based on an analysis of partial data of the audio signal, wherein the partial data corresponds to a partial time of a reproduction time of the audio signal.

13. The signal processing apparatus according to claim 1, wherein the CPU is further configured to estimate the stationary signal component based on an analysis of partial data of the audio signal, wherein the partial data corresponds to an initial partial time of a reproduction time of the audio signal.

14. The signal processing apparatus according to claim 1, wherein the CPU is further configured to:

analyze partial data of the audio signal, wherein the partial data corresponds to an intermediate partial time of a reproduction time of the audio signal, estimate the stationary signal component based on the analysis of the partial data, and update the estimated stationary signal component based on the analyzed partial data.

15. The signal processing apparatus according to claim 1, further comprising:

an encoder configured to encode the audio signal, wherein the audio signal includes the reduced estimated stationary signal component.

16. A signal processing method, comprising:

band-dividing an audio signal into a first signal component and a second signal component, wherein the first signal component comprises a first frequency greater than or equal to a first threshold and wherein the second signal component comprises a second frequency less than the first threshold;

orthogonally transforming the first signal component;

analyzing the orthogonally transformed first signal component;

estimating, based on the analysis of the orthogonally transformed first signal component, a stationary signal component of the first signal component, wherein the stationary signal component has a third frequency greater than the first threshold;

reducing the estimated stationary signal component based on the first signal component;

synthesizing the reduced estimated stationary signal component and the second signal component to produce an enhanced audio signal; and outputting the enhanced audio signal.

17. A signal processing apparatus, comprising:

a central processing unit (CPU) configured to:

orthogonally transform an audio signal;

analyze the orthogonally transformed audio signal, estimate, based on the analysis, a stationary signal component of the audio signal that has a frequency greater than a threshold;

reduce the estimated stationary signal component in the audio signal based on a low-pass filter, wherein a cut-off frequency of the low-pass filter is based on an amplification amount of the audio signal, to produce an enhanced audio signal; and output the enhanced audio signal through an audio output device.

18. A signal processing apparatus, comprising:

a central processing unit (CPU) configured to:

orthogonally transform an audio signal;

analyze the orthogonally transformed audio signal;

estimate, based on the analysis, a stationary signal component of the audio signal that has a frequency greater than a threshold;

reduce the estimated stationary signal component based on a low-pass filter to produce an enhanced audio signal, wherein the low-pass filter has an inclination of a frequency characteristic in a band equal to or greater than a cut-off frequency, and wherein the inclination of the frequency characteristic is based on an amplification amount of the audio signal, and output the enhanced audio signal through an audio output device.

19. A signal processing apparatus, comprising:

a central processing unit (CPU) configured to:

orthogonally transform an audio signal;

analyze the orthogonally transformed audio signal;

estimate, based on the analysis, a stationary signal component of the audio signal that has a frequency greater than a threshold;

reduce the estimated stationary signal component based on a treble shelving filter, wherein a gain of the treble shelving filter is based on an amplification amount of the audio signal, to produce an enhanced audio signal; and output the enhanced audio signal through an audio output device.

* * * * *